US012601968B2

(12) United States Patent
Baur et al.

(10) Patent No.: US 12,601,968 B2
(45) Date of Patent: Apr. 14, 2026

(54) METHOD AND APPARATUS FOR PROCESSING A SAMPLE

(71) Applicant: Carl Zeiss SMT GmbH, Oberkochen (DE)

(72) Inventors: Christof Baur, Oberkochen (DE); Julia Weber, Oberkochen (DE); Dominik Schnoor, Oberkochen (DE); Maximilian Rumler, Oberkochen (DE); Johannes Schoeneberg, Oberkochen (DE); Kinga Kornilov, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 290 days.

(21) Appl. No.: 18/236,120

(22) Filed: Aug. 21, 2023

(65) Prior Publication Data

US 2023/0418153 A1     Dec. 28, 2023

Related U.S. Application Data

(63) Continuation of application No. PCT/EP2022/054275, filed on Feb. 21, 2022.

(30) Foreign Application Priority Data

Feb. 22, 2021    (DE) .......................... 102021201669.3

(51) Int. Cl.
*G03F 1/84* (2012.01)
*G01Q 80/00* (2010.01)
*G03F 1/72* (2012.01)

(52) U.S. Cl.
CPC ............... *G03F 1/84* (2013.01); *G01Q 80/00* (2013.01); *G03F 1/72* (2013.01)

(58) Field of Classification Search
CPC .............. G03F 1/84; G03F 1/72; G01Q 80/00
See application file for complete search history.

(56) References Cited

U.S. PATENT DOCUMENTS

| | | | |
|---|---|---|---|
| 8,287,653 B2 | 10/2012 | Robinson et al. | |
| 10,691,207 B2 | 6/2020 | Biggs et al. | |

(Continued)

FOREIGN PATENT DOCUMENTS

| | | | | |
|---|---|---|---|---|
| DE | 102005004070 | 8/2006 | ............... | G03F 1/14 |
| DE | 202017007361 | 12/2020 | ............. | G01N 15/10 |

(Continued)

OTHER PUBLICATIONS

International Search Report and Written Opinion of the International Searching Authority for International Application No. PCT/EP2022/054275, dated Jul. 18, 2022.

(Continued)

*Primary Examiner* — Nicole M Ippolito
(74) *Attorney, Agent, or Firm* — Fish & Richardson P.C.

(57)    ABSTRACT

The invention proposes a method for processing a sample with a processing arrangement, comprising the steps of:
  taking up a particle adhering on a sample surface of the sample with a measuring tip of the processing arrangement;
  modifying a physical and/or chemical nature of a surface section on the sample or on a deposition unit for providing an activated surface section; and
  moving the measuring tip into an interaction region of the activated surface section in which an attractive interaction acts between the particle taken up by the measuring tip and the activated surface section in order to transfer the particle from the measuring tip to the activated surface section.

22 Claims, 13 Drawing Sheets

(56)     References Cited

U.S. PATENT DOCUMENTS

| 2003/0138644 | A1* | 7/2003 | Khandros | ........... | B08B 7/0028 |
| | | | | | 428/447 |
| 2007/0037071 | A1 | 2/2007 | Noelscher et al. | | |
| 2017/0292923 | A1 | 10/2017 | Baralia et al. | | |
| 2020/0249564 | A1 | 8/2020 | Budach et al. | | |
| 2023/0158555 | A1* | 5/2023 | Robinson | ............. | G03F 7/0002 |
| | | | | | 134/6 |

FOREIGN PATENT DOCUMENTS

| EP | 3 251 760 | 12/2017 | ............... | B08B 7/00 |
| EP | 3 272 432 | 1/2018 | ............. | G03F 1/82 |
| JP | 2004-340629 | 12/2004 | ............. | G01R 1/06 |
| KR | 1020040077877 | 9/2004 | ............. | C08L 83/04 |
| KR | 10-2017-0131273 A | 11/2017 | | |
| KR | 1020170131264 | 11/2017 | ............. | G03F 7/20 |
| KR | 10-2020-0142075 A | 12/2020 | | |
| TW | 201714049 | 4/2017 | ............. | G06F 3/023 |
| TW | 202043913 | 12/2020 | ............. | G03F 1/74 |
| WO | WO 2019/016224 | 1/2019 | ............. | G03F 1/72 |

OTHER PUBLICATIONS

Office Action issued by the Korean Patent Office for Application No. KR 10-2023-7032077, dated Apr. 30, 2025 (with English Translation).

Notice of Allowance in Korean Appln. No. 10-2023-7032077, mailed on Jan. 19, 2026, 7 pages (with English translation).

* cited by examiner

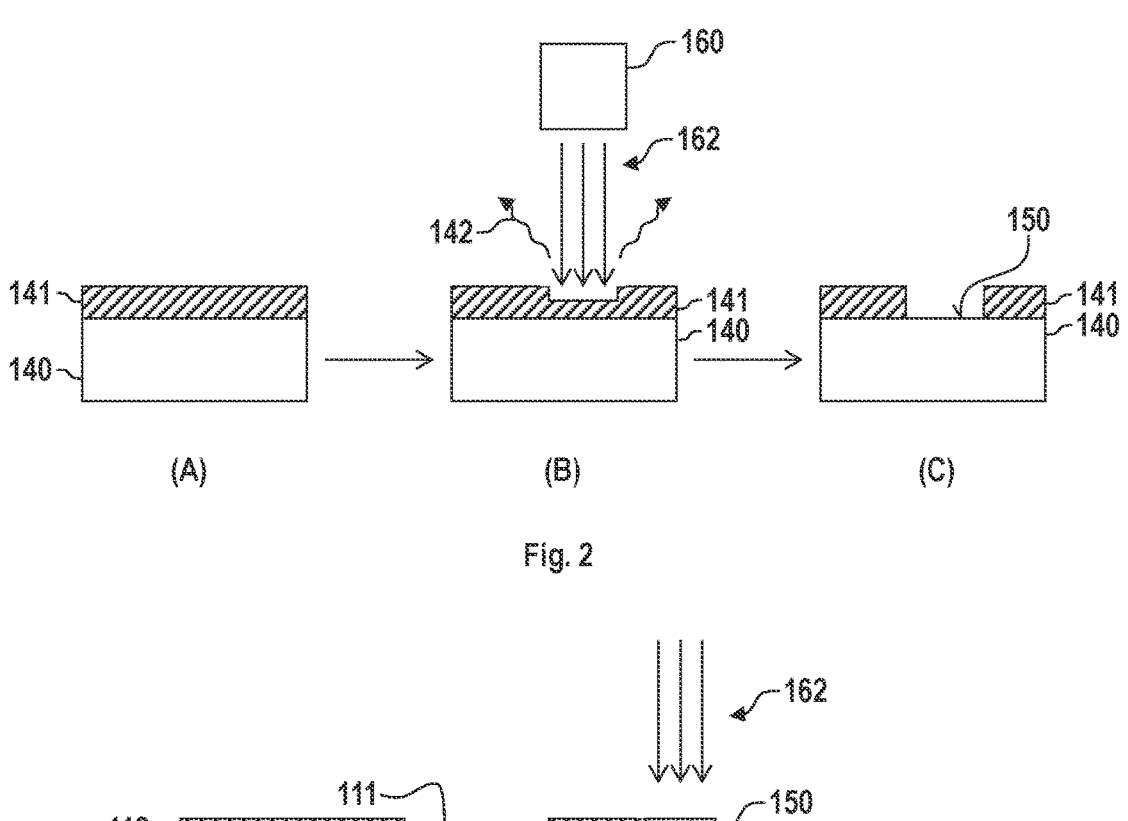
Fig. 2
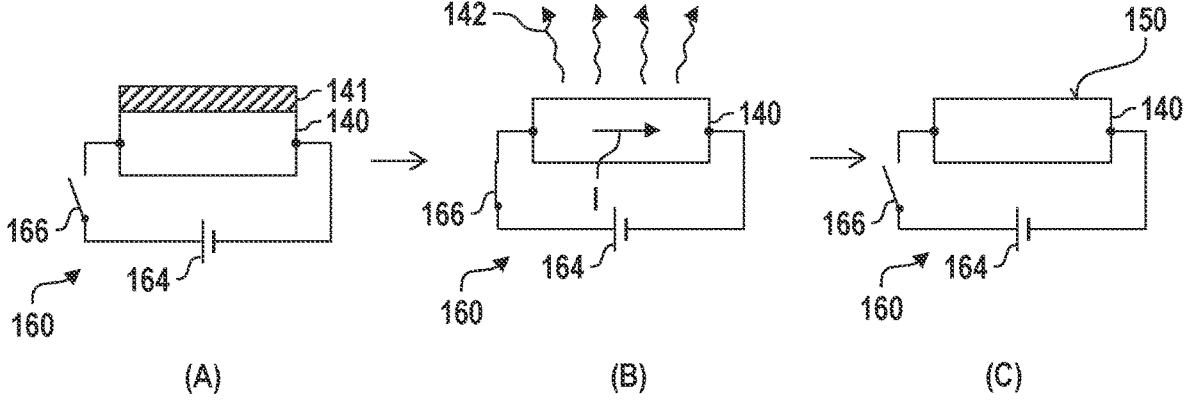
Fig. 3
Fig. 4

(A)

(B)

(C)

METHOD AND APPARATUS FOR PROCESSING A SAMPLE

CROSS-REFERENCE TO RELATED APPLICATIONS

This application is a continuation of and claims priority under 35 U.S.C. § 120 from PCT Application No. PCT/EP 2022/054275, filed on Feb. 21, 2022, which claims priority from German Application No. DE 10 2021 201 669.3, filed on Feb. 22, 2021. The entire contents of each of these priority applications are incorporated herein by reference.

TECHNICAL FIELD

The present invention relates to a method and an apparatus for processing a sample.

BACKGROUND

Microlithography is used for producing microstructured components, such as for example integrated circuits. The microlithography process is performed using a lithography apparatus, which has an illumination system and a projection system. The image of a mask (reticle) illuminated by use of the illumination system is in this case projected by use of the projection system onto a substrate, for example a silicon wafer, which is coated with a light-sensitive layer (photoresist) and arranged in the image plane of the projection system, in order to transfer the mask structure to the light-sensitive coating of the substrate.

The mask, or lithography mask, is used for a multiplicity of exposures, for which reason it is of enormous importance that the mask be free of defects and free of contaminations. A correspondingly high effort is therefore made to examine lithography masks for defects and contaminations and to repair defects that are found or remove contaminations. Defects or contaminations can have an order of magnitude in the range of a few nanometres. Removing such defects or contaminations therefore requires apparatuses which offer a very high spatial resolution for the repair processes.

The contaminations are for example extremely small particles which have deposited on the mask from the surroundings. Such contaminations occur to an increased extent, for example, when the mask is transferred between different apparatuses. The particles are of a very diverse nature and have different sizes and/or shapes. They may for example be metal particles, in particular tin, but ceramic particles, polymer particles and further carbon compounds may also occur. The particles are typically adsorbed on the mask surface, that is to say in particular that there are no strong chemical bonds, such as atomic bonds, between the particle material and the mask surface.

From a thermodynamic point of view, a particle will leave the surface if this will reduce the total energy of the system. This is the case, for example, when the particle is transferred from a surface with a low surface energy to a surface with a high surface energy (for the same contact surface). Depending on the interaction existing between the particle and the surface, activation energy may be necessary to break the existing bonds.

Apparatuses are known with which individual particles are removed from a surface in a targeted manner. For example, atomic force microscopes are used for this purpose. These take up the particle with the measuring tip and thus remove it from the surface. In order to be able to use a measuring tip for more than just a single particle, it is desirable to remove the particle taken up from the measuring tip again.

U.S. Pat. No. 8,287,653 B2 discloses a method in which a coated measuring tip is used to take up particles from a surface to be cleaned and then to deposit them on a deposition surface. Here, the measuring tip has a coating having a low surface energy which is intended to facilitate the removal of a particle that has been taken up.

DE 10 2005 004 070 B3 discloses a method for removing defect material from a lithography mask. In one embodiment of the method here, a measuring tip of an atomic force microscope is used as a plane to remove defect material.

WO 2019/016224 A1 discloses a method for removing excess material from a lithography mask. In this document, a measuring tip of an atomic force microscope is used to displace the excess material on the lithography mask and/or to remove it from the lithography mask.

DE 20 2017 007 361 U1 discloses a foreign body collection and metrological apparatus for determining a composition of a particle, wherein the foreign body collection and metrological apparatus comprises: a means for transferring the particle to a scanning probe microscope tip (SPM tip); a radiation source which is designed to irradiate the particle on the SPM tip with a first incident radiation; a radiation detector which is designed to detect a first probe radiation from the particle which is caused by the first incident radiation; and a controller which is designed to receive a first signal from the radiation detector which is a response to the first probe radiation, to analyze the first signal and to identify one or more material properties of the particle on the SPM tip.

SUMMARY

Against this background, it is a general aspect of the present invention to improve the processing of a sample.

In accordance with a first aspect, a method for processing a sample with a processing arrangement is proposed. The method comprises taking up a particle adhering on a sample surface of the sample with a measuring tip of the processing arrangement, and further comprises providing a microstructured surface section having a specific microstructure on the sample or on a deposition unit, a cross section of the specific microstructure having a periodic profile in a first cross-sectional plane. The method additionally comprises moving the measuring tip into an interaction region of the microstructured surface section in which an interaction acts between the particle taken up by the measuring tip and the microstructured surface section in order to transfer the particle from the measuring tip to the microstructured surface section.

This method has the advantage that the particle can be reliably and efficiently removed from the sample and transferred to the microstructured surface section. As a result of the periodic structure, a suitable deposition or transfer position on the microstructured surface section can be rapidly found, since these suitable positions are provided at many points and not only in a narrowly delimited spatial region which would first have to be found.

The sample is for example a lithography mask with a structure size in the range of 10 nm-10 μm. This can be for example a transmissive lithography mask for DUV lithography (DUV: "deep ultraviolet", operating light wavelengths in the range from 30-250 nm) or a reflective lithography mask for EUV lithography (EUV: "extreme ultraviolet", operating light wavelengths in the range from 1-30 nm).

The sample may also be a microelectronic component, such as for example an integrated circuit, in particular a CPU (CPU: "central processing unit"), GPU (GPU: "graphics processing unit"), a RAM memory (RAM: "random access memory"), a flash memory and the like.

The processing arrangement for example has a measuring tip attached to a cantilever. The measuring tip for example has a length in the range from 0.1 µm-1 mm and a diameter in the range from 0.4 nm-1 µm. In particular, the measuring tip may taper towards the free end. The measuring tip for example is composed of a material comprising carbon, silicon, a noble metal and the like. The measuring tip may also have at its surface a coating of a further material, in particular with the aim of providing a specific surface energy. The measuring tip may also be referred to as manipulator tip or just simply as tip.

The term "surface energy" is understood in particular to be the energy that has to be expended per unit of surface area to create the surface. It may also be said that the surface energy becomes free when a unit of surface area of the free surface is covered. A free surface having high surface energy represents a high-energy thermodynamic state. When the free surface is at least partially covered, for example with the particle, the free energy of the overall system is in particular reduced, which is thermodynamically favoured, for which reason the particle will be preferentially adsorbed onto surfaces having high surface energy. The term "surface energy" is in particular understood in the present case to mean all possible interactions that a particular surface may have with another body. Therefore, specific chemical bonds which may not be present equally between all surfaces may also be subsumed under the term "surface energy". Interactions that contribute to the surface energy are for example electrostatic interactions, such as van der Waals forces, dipole-dipole interactions, ionic bonds or dispersion forces, and also molecule-specific or atom-specific interactions, such as atomic bonds (covalent bonds), hydrogen bonds or metallic bonds.

With the measuring tip, it is possible to move to individual positions on the sample surface in a targeted manner, particularly even when the sample has structures having a high aspect ratio. The aspect ratio may be defined for example as the ratio of width to height of a structure. An example of a structure having a high aspect ratio of 1:10 is a narrow, deep trench which for example is 1 µm wide and 10 µm deep.

The processing arrangement preferably has a positioning unit on which the cantilever is arranged and with which the cantilever can be moved in all three spatial directions. The positioning unit is preferably further configured to rotate the cantilever about up to three axes. An orientation of the measuring tip can be freely adjusted as a result. The processing arrangement may in particular comprise an atomic force microscope, in which the measuring tip is assigned to the atomic force microscope.

If the measuring tip comes into the vicinity of the sample surface, an interaction arises between the measuring tip and the sample surface. The interaction may be based on direct contact, on a van der Waals interaction or other physical interactions, and mixtures thereof. By scanning the sample surface with the measuring tip, a three-dimensional image of the sample surface can be recorded. Here, for example, for each scanning position the distance between the measuring tip and the sample surface is kept constant by use of a closed-loop control circuit and a position of a microactuator for adjusting the distance is recorded.

In particular, the particle is a foreign body, such as dust or dirt, which has deposited on the sample surface. It may also be said that the particle is adsorbed on the sample surface. Different particles may have a different nature and different shapes. The size of the particles ranges in particular from 5 nm-10 µm.

Such a particle may for example be located on the sample surface using optical analysis methods and approached by the measuring tip in a targeted manner. In order to take up the particle with the measuring tip, the particle must be detached from the sample surface. That means that the forces acting between the sample surface and the particle must be overcome. The strength with which the particle is bonded to the sample surface depends both on the shape and nature of the particle and on the nature of the sample surface, in particular the surface energy thereof. The higher the surface energy of the sample surface, the stronger the particle is adsorbed. In addition, specific interactions such as covalent atomic bonds, hydrogen bonds, electrostatic interactions and the like between the particle and the sample surface may arise, which further reinforce the bonding of the particle to the sample surface.

To take up the particle with the measuring tip, the measuring tip is for example brought into contact with the particle. If the sample surface has a low surface energy, the particle will in particular be able to be detached therefrom readily and can be taken up by the measuring tip. It may be advantageous if the surface energy of the measuring tip is greater than the surface energy of the sample surface, since for an equally large contact surface the particle then adheres to the measuring tips. In this case, the particle bonds to the measuring tip; it can also be said that it is adsorbed on the measuring tip. The strength of this bond depends in turn both on the shape and nature of the particle and on the nature of the surface of the measuring tip, in particular the surface energy thereof. In addition, specific interactions between the surface of the measuring tip and of the particle may also arise here.

It may be helpful to first use the measuring tip to displace the particle on the sample surface in order to break existing bonds. This can for example result in a reduction in the bonding energy of the particle to the surface. Furthermore, a contact surface between the measuring tip and the particle may for example be increased as a result. If the contact surface between the particle and the measuring tip becomes larger, the probability that the particle will adhere to the measuring tip and be able to be detached from the sample surface increases.

After the particle has been taken up by the measuring tip, the particle must be removed from the measuring tip again in order to be able to use the measuring tip further. The particle should in this case in particular be deposited at a position on the sample surface at which it is not a disturbance, or on a separate deposition unit. The bonding of the particle to the corresponding surface after the deposition is in this case preferably particularly strong, that is to say the bonding energy is high. This can be achieved when the corresponding surface has a high surface energy. In addition and/or alternatively to this, the surface may be composed of a material that can form chemical bonds with a great many elements, such as for example silicon. This firstly achieves that the particle is durably bonded to the surface and no longer detaches, and secondly that the transferring of the particle from the measuring tip is facilitated.

The particle adsorbs on the microstructured surface, with various physicochemical effects possibly arising. Reference may also be made to "physisorption" and "chemisorption". In physisorption, electrostatic interactions such as van der Waals interactions occur in particular between the particle and the microstructured surface. In chemisorption, chemical bonds such as covalent atomic bonds may additionally form between the particle and the microstructured surface.

In order to transfer the particle, the measuring tip with the particle is brought into an interaction region of the micro-structured surface. "Interaction region" is understood in the present case in particular to be a spatial vicinity in which, for example, an attractive interaction acts between the particle and the microstructured surface. In the interaction region, the probability that the particle will be transferred from the measuring tip to the microstructured surface is very high. The interaction region may in particular comprise a certain region above the microstructured surface, such as for example a region between 0-100 nm distance from the microstructured surface. A direct contact of the particle with the microstructured surface is best suited for transferring the particle.

Supportive measures may be taken to increase the inter-action region, so that the particle is transferred for example without direct contact with the microstructured surface. For example, a voltage (DC voltage or AC voltage) may be applied between the measuring tip and the microstructured surface. Furthermore, the particle may be excited by a laser beam or the like, which can have the consequence of detaching the particle from the measuring tip, preferably directly above the microstructured surface. The particle will then for example "fall" onto the microstructured surface. In addition, the measuring tip may be set into oscillation so that the particle is "shaken off".

It should be noted that the measuring tip may also take up two or more particles, for example at different positions of the measuring tip, before the particles are transferred to the microstructured surface. This is possible in particular when the bonding of individual particles to the measuring tip is so strong that unintended "falling off" of the particles from the measuring tip is excluded or at least very unlikely.

The cross section of the specific microstructure in par-ticular lies in the first cross-sectional plane, which extends non-parallel to a main plane of extent of the sample or of the deposition unit. The main plane of extent is for example the plane in which lies the surface of the sample or of the deposition unit outside of the microstructured surface sec-tion, in particular a flat surface section. If the sample or the deposition unit is not essentially macroscopically flat but instead has a curved profile and/or is flat only in sections, with various flat sections lying in a plane tilted with respect to each other, the main plane of extent for a particular section or at a particular point can be defined as that plane which lies perpendicular to a normal vector to the sample or the deposition unit.

That a cross section of the microstructure has a periodic profile is understood for example to mean that a boundary line along the surface of the sample or of the deposition unit and the surrounding space can be described at least in sections by a periodic function.

The periodic microstructure can be periodic in one direc-tion or in two or more directions. An example of a one-directionally periodic structure is a sine function which is constant in a direction perpendicular to the sinusoidal varia-tion. An example of an at least two-directionally periodic function is a chequerboard pattern in which light squares represent an elevation and dark squares represent a depres-sion. An at least two-directionally periodic microstructure is for example obtained by superposing two structures that are periodic in a respective direction on one another, the respec-tive directions of the periodicity not lying parallel to one another.

The periodic microstructure may have various geometric basic patterns. A respective geometric basic pattern that repeats periodically in the microstructure may have piece-wise linear sections and/or sections extending piecewise in a curved manner. Sections extending in a curved manner may for example be circular arc-shaped, parabolic, hyper-bolic, sinusoidal and the like. Two or more sections having a different shape and/or orientation may be arranged next to one another. For example, a sawtooth pattern is obtained by arranging two linear sections next to one another tilted with respect to one another.

The microstructure for example has a structure size in the range of up to ten micrometres, with preference at most five micrometres, preferably at most two micrometres, more preferably at most one micrometre. The structure size relates for example to a period of the periodic microstructure and/or to an amplitude or height of the microstructure.

The microstructured surface section may also be referred to as activated surface section in the context of the present disclosure.

The transferring of the particle can also be referred to as wiping off. To this end, the measuring tip is for example wiped over the specific microstructure. It may also be said that the particle is brushed off on the microstructure. The interaction between the particle on the measuring tip and the microstructure in particular includes, considered macro-scopically, a friction force of the particle on the surface when the particle is brought into contact with the surface. The particle can additionally snag on the individual structures of the microstructure, especially on edges of the microstruc-ture, and get "caught" thereon. Considered microscopically, an electrostatic interaction between atoms and/or molecules of the particle and atoms and/or molecules of the surface, such as van der Waals interactions, may occur in particular. From a microscopic viewpoint, chemical interactions are also possible, that is to say for example the formation of a chemical bond between the particle and the surface. In addition, a long-range electrostatic interaction may be pres-ent when for example the particle is positively or negatively charged and/or the microstructure is positively and/or nega-tively charged. Since an electric field strength of close charged surfaces depends on a curvature of the surface, the electric field exhibits a variation over a charged microstruc-ture, with the electric field strength being high in the region of significant curvature (small radius of curvature), which can positively support the transferring of the particle.

According to one embodiment, the cross section has a zigzag profile.

A zigzag profile corresponds for example to the profile of a sawtooth voltage or else a triangular voltage.

According to a further embodiment, the first cross-sec-tional plane lies perpendicular to a main plane of extent of the sample or of the deposition unit and a further cross section of the specific microstructure is constant in a second cross-sectional plane perpendicular to the first cross-sec-tional plane and perpendicular to the main plane of extent.

According to a further embodiment of the method, the microstructured surface section comprises a plurality of regions having respective microstructures, with microstruc-tures being structured differently in different regions.

This embodiment has the advantage that different micro-structures are available for transferring the particle. For example, depending on a shape, nature, size and/or position of the particle on the measuring tip, different microstructures may have different suitability for rapidly and efficiently transferring the particle.

It should be noted that not every microstructure needs to be periodic as is required for the specific microstructure. A microstructure which is unordered may therefore also be present in a region.

According to a further embodiment of the method, a first region has the specific microstructure and a second region has a second microstructure, wherein the first cross-sectional plane of the second microstructure extends differently to the main plane of extent and obliquely to the first cross-sectional plane of the specific microstructure.

For example, the second microstructure has the same geometric basic shape as the first microstructure, and thus has the same periodic profile, but the direction in which the profile is periodic is different from that for the specific microstructure in the first region. In other words, the second microstructure is arranged rotated compared to the first microstructure.

It should be noted that more than two regions having correspondingly different microstructures may be provided.

According to a further embodiment of the method, a first region has the specific microstructure and the specific microstructure has first values for structure parameters, wherein the structure parameters comprise a height, a first angle, a second angle and/or a spatial frequency along the first cross-sectional plane, and wherein a second region has a second microstructure which has a value for at least one of the structure parameters which is different from the first value.

For example, the second microstructure has the same geometric basic shape as the specific microstructure but has a different spatial frequency to the specific microstructure. In further examples, the geometric basic shape of the second microstructure differs compared to the first microstructure, for example one is a triangular structure and the other is a sawtooth structure, which can be achieved in particular by different first and second angles.

It should be noted that more than two regions having correspondingly different microstructures may be provided.

According to a further embodiment of the method, a first region has the specific microstructure and a further region has a further microstructure, wherein the further microstructure has a cross section comprising an overhang.

The cross section with the overhang in particular lies in a cross-sectional plane which extends perpendicularly to the main plane of extent.

It may also be said that the microstructure has an undercut. This microstructure thus provides in particular an edge at which the particle can be wiped off. This may be helpful for some particles which can barely be transferred, if at all, to the specific microstructure. However, in order to wipe off the particle on the edge of the overhang, a more exact control of the measuring tip and a more complex movement relative to the microstructure is required than for the wiping off on the specific microstructure.

According to a further embodiment of the method, the latter additionally comprises selecting a region from the plurality of regions depending on an adhesion position of the particle taken up by the measuring tip and/or on a property of the particle, the property comprising a size of the particle, a shape of the particle and/or a nature of the particle, and comprises transferring the particle to the microstructure in the selected region.

Selecting the region can be equated to selecting the microstructure present in the region.

The shape of the particle may for example include round, oval, elongate, filamentary and the like. The nature of the particle may relate to a material of which the particle is composed, or else to a surface roughness of the particle and the like.

According to a further embodiment of the method, the adhesion position and/or the property of the particle is determined depending on an image of the particle, in particular an electron micrograph, captured before and/or after taking up the particle with the measuring tip.

In this embodiment, the processing arrangement comprises a microscope, especially an electron microscope. The microscope can also be used to monitor the taking up and the transferring of the particle. Furthermore, the microscope can be used to monitor and control the movement of the measuring tip.

According to a further embodiment of the method, the respective microstructure is produced by a selective etching process and/or deposition process on the surface of the sample or of the deposition unit.

In this embodiment, the microstructure is monolithically integrated into the surface. The selective etching process for example means that the sample or the deposition unit, in the surface section in which the microstructure is intended to be provided, is coated with a resist layer which is structured by a suitably modulated exposure and subsequently removed, the exposed regions remaining on the surface. An etching process, which may be wet- and/or dry-chemical, or a deposition process is then carried out. The exposed parts of the resist layer mean that the surface is protected at points with the result that in these regions there is no removal of material of the surface or application of material to the surface.

According to a further embodiment of the method, this additionally comprises modifying a physical and/or chemical nature of the microstructured surface section, in that the microstructured surface section is irradiated with a particle beam and/or is heated and/or is coated.

The particle beam is for example a light beam, especially a laser beam, an electron beam or else an ion beam. As a result of the particle beam, the microstructured surface section may for example be electrostatically charged, heated and/or a chemical structure or order of the atoms in the surface may be broken, disrupted and/or converted.

According to a further embodiment of the method, the sample or the deposition unit includes a material selected from the group comprising silicon, silicon carbide, tungsten, tungsten carbide, cobalt, carbon, indium and platiniridium.

According to a further embodiment of the method, the transferring of the particle to the microstructured surface section comprises wiping off the particle by way of a movement of the measuring tip relative to the sample or the deposition unit.

According to a further embodiment of the method, the measuring tip is heated, irradiated and/or electrically charged for the transferring of the particle.

The irradiation is effected in particular with a particle beam, as already described above with respect to the microstructured surface section.

According to a further embodiment of the method, the microstructured surface section is heated, irradiated and/or electrically charged before, during and/or after the transferring of the particle.

According to a further embodiment of the method, the sample and the processing arrangement or the sample, the processing arrangement and the deposition unit are arranged in a vacuum housing.

According to a further embodiment of the method, the particle adsorbed on the microstructured surface section is analyzed in situ with a particle beam.

The analysis may be effected in particular by use of electron beams and/or X-ray radiation.

In accordance with a second aspect, an apparatus for analyzing and/or processing a sample is proposed. The apparatus comprises a processing arrangement comprising a measuring tip for taking up a particle adhering on a sample surface of the sample. A microstructured surface section having a specific microstructure is present on the sample or on a deposition unit separate from the sample, a cross section of the specific microstructure having a periodic profile in a first cross-sectional plane. The processing arrangement additionally comprises a movement unit which is configured to move the measuring tip into an interaction region of the microstructured surface section in which an interaction acts between the particle taken up by the measuring tip and the microstructured surface section in order to transfer the particle taken up from the measuring tip to the microstructured surface section.

The embodiments and features described for the proposed method according to the first aspect are correspondingly applicable to the proposed apparatus and vice versa. The apparatus further has the advantages described with reference to the method.

The method according to the first aspect is preferably conducted with an apparatus according to the second aspect.

According to an embodiment of the apparatus, the latter additionally comprises an electron microscope for capturing an image of the sample, of the measuring tip, of the deposition unit and/or of the particle, when the latter is disposed on the sample surface, on the measuring tip and/or on the microstructured surface section.

In accordance with a third aspect, a method for processing a sample with a processing arrangement is proposed. The method comprises taking up a particle adhering on a sample surface of the sample with a measuring tip of the processing arrangement, and capturing an image of the particle taken up by the measuring tip, and determining one or more properties of the particle taken up by the measuring tip depending on the captured image. The one or more properties include, for example, a size, a shape, a nature, and/or an adhesion position of the particle on the measuring tip. The method moreover comprises selecting a microstructure from a plurality of different microstructures that are disposed in a microstructured surface section on the sample or on a deposition unit, depending on the properties determined; and further comprises moving the measuring tip into an interaction region of the selected microstructure in the microstructured surface section in which an interaction acts between the particle taken up by the measuring tip and the selected microstructure in order to transfer the particle from the measuring tip to the microstructured surface section.

The embodiments and features described for the proposed method according to the first aspect are correspondingly applicable to the proposed method according to the third aspect and vice versa. The method is preferably conducted with an apparatus according to the second aspect.

It should be noted that the image of the particle, on the basis of which the one or more properties of the particle are determined, can already be captured before the particle has been taken up with the measuring tip.

According to an embodiment of the method, a movement sequence for the measuring tip is additionally selected from a plurality of different movement sequences depending on the determined properties and/or on the selected microstructure, and the measuring tip is moved in accordance with the selected movement sequence in order to transfer the particle.

Specific movement sequences may be particularly well suited for different particle properties or combinations of particle properties and microstructures in order to transfer the particle rapidly and efficiently.

In accordance with a fourth aspect, a method for processing a sample with a processing arrangement is proposed. In a first step, a particle adhering on a sample surface of the sample is taken up with a measuring tip of the processing arrangement. In a second step, a physical and/or chemical nature of a surface section on the sample or on a deposition unit is modified for providing an activated surface section. In a third step, the measuring tip is moved into an interaction region of the activated surface section in which an attractive interaction acts between the particle taken up by the measuring tip and the activated surface section in order to transfer the particle from the measuring tip to the activated surface section.

This method has the advantage that, on account of the attractive interaction between the particle and the activated surface section (hereinafter also referred to simply as activated surface), the particle can firstly be transferred from the measuring tip to the activated surface in a simplified manner and, secondly, the particle does not become detached again from the activated surface by itself and hence is secured to said surface. The particle can thus be removed from the sample surface very efficiently and reliably.

The definitions, embodiments and advantages given below apply accordingly to the first, second and third aspects. Statements relating below to the activated surface section in particular apply accordingly to the microstructured surface section.

The sample is for example a lithography mask with a structure size in the range of 10 nm-10 μm. This can be for example a transmissive lithography mask for DUV lithography (DUV: "deep ultraviolet", operating light wavelengths in the range from 30-250 nm) or a reflective lithography mask for EUV lithography (EUV: "extreme ultraviolet", operating light wavelengths in the range from 1-30 nm).

The sample may also be a microelectronic component, such as for example an integrated circuit, in particular a CPU (CPU: "central processing unit"), GPU (GPU: "graphics processing unit"), a RAM memory (RAM: "random access memory"), a flash memory and the like.

The processing arrangement for example has a measuring tip attached to a cantilever. The measuring tip for example has a length in the range from 0.1 μm-1 mm and a diameter in the range from 0.4 nm-1 μm. In particular, the measuring tip may taper towards the free end. The measuring tip for example is composed of a material comprising carbon, silicon, a noble metal and the like. The measuring tip may also have at its surface a coating of a further material, in particular with the aim of providing a specific surface energy. The measuring tip may also be referred to as manipulator tip or just simply as tip.

The term "surface energy" is understood in particular to be the energy that has to be expended per unit of surface area to create the surface. It may also be said that the surface energy becomes free when a unit of surface area of the free surface is covered. A free surface having high surface energy represents a high-energy thermodynamic state. When the free surface is at least partially covered, for example with the particle, the free energy of the overall system is in particular reduced, which is thermodynamically favoured, for which reason the particle will be preferentially adsorbed onto surfaces having high surface energy. The term "surface energy" is in particular understood in the present case to mean all possible interactions that a particular surface may have with another body. Therefore, specific chemical bonds which may not be present equally between all surfaces may also be subsumed under the term "surface energy". Interactions that contribute to the surface energy are for example electrostatic interactions, such as van der Waals forces, dipole-dipole interactions, ionic bonds or dispersion forces, and also molecule-specific or atom-specific interactions, such as atomic bonds (covalent bonds), hydrogen bonds or metallic bonds.

With the measuring tip, it is possible to move to individual positions on the sample surface in a targeted manner, particularly even when the sample has structures having a high aspect ratio. The aspect ratio may be defined for example as the ratio of width to height of a structure. An example of a structure having a high aspect ratio of 1:10 is a narrow, deep trench which for example is 1 μm wide and 10 μm deep.

The processing arrangement preferably has a positioning unit on which the cantilever is arranged and with which the cantilever can be moved in all three spatial directions. The positioning unit is preferably further configured to rotate the cantilever about up to three axes. An orientation of the measuring tip can be freely adjusted as a result. The processing arrangement may in particular comprise an atomic-force microscope, in which the measuring tip is assigned to the atomic force microscope.

If the measuring tip comes into the vicinity of the sample surface, an interaction arises between the measuring tip and the sample surface. The interaction may be based on direct contact, on a van der Waals interaction or other physical interactions, and mixtures thereof. By scanning the sample surface with the measuring tip, a three-dimensional image of the sample surface can be recorded. Here, for example, for each scanning position the distance between the measuring tip and the sample surface is kept constant by use of a closed-loop control circuit and a position of a microactuator for adjusting the distance is recorded.

In particular, the particle is a foreign body, such as dust or dirt, which has deposited on the sample surface. It may also be said that the particle is adsorbed on the sample surface. Different particles may have a different nature and different shapes. The size of the particles ranges in particular from 5 nm-10 μm.

Such a particle may for example be located on the sample surface using optical analysis methods and approached by the measuring tip in a targeted manner. In order to take up the particle with the measuring tip, the particle must be detached from the sample surface. That means that the forces acting between the sample surface and the particle must be overcome. The strength with which the particle is bonded to the sample surface depends both on the shape and nature of the particle and on the nature of the sample surface, in particular the surface energy thereof. The higher the surface energy of the sample surface, the stronger the particle is adsorbed. In addition, specific interactions such as covalent atomic bonds, hydrogen bonds, electrostatic interactions and the like between the particle and the sample surface may arise, which further reinforce the bonding of the particle to the sample surface.

To take up the particle with the measuring tip, the measuring tip is for example brought into contact with the particle. If the sample surface has a low surface energy, the particle will in particular be able to be detached therefrom readily and can be taken up by the measuring tip. It may be advantageous if the surface energy of the measuring tip is greater than the surface energy of the sample surface, since for an equally large contact surface the particle then adheres to the measuring tips. In this case, the particle bonds to the measuring tip; it can also be said that it is adsorbed on the measuring tip. The strength of this bond depends in turn both on the shape and nature of the particle and on the nature of the surface of the measuring tip, in particular the surface energy thereof. In addition, specific interactions between the surface of the measuring tip and of the particle may also arise here.

It may be helpful to first use the measuring tip to displace the particle on the sample surface in order to break existing bonds. This can for example result in a reduction in the bonding energy of the particle to the surface. Furthermore, a contact surface between the measuring tip and the particle may for example be increased as a result. If the contact surface between the particle and the measuring tip becomes larger, the probability that the particle will adhere to the measuring tip and be able to be detached from the sample surface increases.

After the particle has been taken up by the measuring tip, the particle must be removed from the measuring tip again in order to be able to use the measuring tip further. The particle should in this case in particular be deposited at a position on the sample surface at which it is not a disturbance, or on a separate deposition unit. The bonding of the particle to the corresponding surface after the deposition is in this case preferably particularly strong, that is to say the bonding energy is high. This can be achieved when the corresponding surface has a high surface energy. In addition and/or alternatively to this, the surface may be composed of a material that can form chemical bonds with a great many elements, such as for example silicon. This firstly achieves that the particle is durably bonded to the surface and no longer detaches, and secondly that the transferring of the particle from the measuring tip is facilitated.

One problem is that material surfaces which are for example in contact with air often form a passivated surface layer which is relatively chemically inert and has a rather low surface energy. For example, a native oxide layer a few nanometres thick forms on pure silicon within a very short time. Since storage under conditions which prevent the formation of such a passivated layer is technically complex and expensive, it is impractical, for example, to hold the deposition unit available with an activated surface until it is used.

In order to achieve a strong interaction between the particle and the surface, it is therefore proposed to modify the physical and/or chemical nature of a surface section on the sample or on a deposition unit so that it for example has a high surface energy and/or is chemically highly reactive with many elements and/or has a geometry which favours the transferring of the particle. A favourable geometry for example makes it possible for the particle to cling to the surface so that a contact surface of the particle is maximized, or edges are provided at which the particle can be wiped off by steric hindrance. Hereinafter, reference is also made for simplification to an activation of the surface. The accordingly modified surface section is referred to as activated surface section. Hereinafter for simplification reference is made only to the activated surface.

The particle adsorbs on the activated surface, with various physicochemical effects possibly arising. Reference may also be made to "physisorption" and "chemisorption". In physisorption, electrostatic interactions such as van der Waals interactions occur in particular between the particle and the activated surface. In chemisorption, chemical bonds such as covalent atomic bonds may additionally form between the particle and the activated surface.

In order to transfer the particle, the measuring tip with the particle is brought into an interaction region of the activated surface. "Interaction region" is understood in the present case in particular to be a spatial vicinity in which an attractive interaction is observable between the particle and the activated surface. In the interaction region, the probability that the particle will be transferred from the measuring tip to the activated surface is very high. The interaction region may in particular comprise a certain region above the activated surface, such as for example a region between 0-100 nm distance from the activated surface. A direct contact of the particle with the activated surface is best suited for transferring the particle.

Supportive measures may be taken to increase the interaction region, so that the particle is transferred for example without direct contact with the activated surface. For example, a voltage (DC voltage or AC voltage) may be applied between the measuring tip and the activated surface. Furthermore, the particle may be excited by a laser beam or the like, which can have the consequence of detaching the particle from the measuring tip, preferably directly above the activated surface. The particle will then for example "fall" onto the activated surface. In addition, the measuring tip may be set into oscillation so that the particle is "shaken off".

It should be noted that the measuring tip may also take up two or more particles, for example at different positions of the measuring tip, before the particles are transferred to the activated surface. This is possible in particular when the bonding of individual particles to the measuring tip is so strong that unintended "falling off" of the particles from the measuring tip is excluded or at least very unlikely.

According to an embodiment of the method, the sample or the deposition unit has a passivated surface in sections, wherein the modifying of the physical and/or chemical nature comprises removal of the passivated surface in sections for providing the activated surface section.

Removing the passivated surface is understood in particular to mean that the passivated surface layer is vaporized from the surface by the supply of energy. Alternatively, an etching process, in particular a particle beam-induced etching process may also be provided. In this case, a reactive gas is supplied to the position to be etched or is generated there from a precursor gas. By removing the passivated layer, the underlying material is exposed, the surface of which has a high surface energy and/or is highly chemically reactive with many elements.

The passivated surface of the sample or of the deposition unit additionally protects them from chemically reacting with process gases or the like.

According to a further embodiment of the method, for the modifying of the physical and/or chemical nature of the surface section for providing the activated surface section, the sample or the deposition unit is irradiated with a particle beam in the surface section.

The particle beam for example comprises a laser beam, an ion beam and/or an electron beam.

In particular, a focused laser beam can be used to supply a very large amount of energy to a point and hence vaporize the material. This principle is employed for example industrially in laser welding installations. This has the advantage that the energy is introduced locally in a targeted manner, for which reason heating of the sample or of the deposition unit as a whole is avoided.

An ion beam can also be used to locally process the material surface, where the irradiated ions bring about a modification of a lattice structure for example by breaking bonds and/or intercalating into the material. It is also possible to use reactive ions which react with the material to form a volatile species and thereby trigger a local etching process.

The particle beam may further be used to capture an image of the sample and/or of the measuring tip. Of particular suitability for this is an electron beam which for example is scanned over the sample surface (scanning electron microscope, SEM). Other image capturing methods using particle beams may also be used. Advantageously, for example, the taking up of the particle and/or the wiping off of the particle by use of the measuring tip can be tracked in real time by this.

According to a further embodiment of the method, for the modifying of the physical and/or chemical nature of the surface section for providing the activated surface section, the sample or the deposition unit is heated in the surface section.

The heating is effected by the supply of energy. As already described above, the energy can be supplied by irradiation with radiation, for example laser radiation. It is also possible to activate an exothermic chemical reaction on the surface in order to provide thermal energy. A further possibility is that of conducting a current through the material which then heats up in a manner comparable with an electrical resistance.

Preference is given here to supplying so much energy that the layers close to the surface, for example the passivation layer, vaporize and hence the bare material is exposed.

In embodiments, the surface section to be activated is heated to the extent that the material on the surface melts. The measuring tip is dipped into the melt for the transferring of the particle. The melt surrounds the measuring tip and the particle, for which reason the particle has a very large contact surface with the melt. Depending on the kind of material that the particle is composed of, the particle may in the process partially or completely melt and join with the molten material.

The supply of energy is ended so that the melt solidifies. Strong bonding forces can form between the particle and the solidified material during the solidification, in particular when the particle has been at least partially fused, and/or the particle is encapsulated by the solidified material, such that it cannot move and remains behind when the measuring tip is withdrawn.

For this embodiment, a deposition unit made from a material which has a low vapour pressure and a low melting point, such as for example indium, is particularly suitable. In addition, the material for the measuring tip is selected such that it does not itself melt in the melt.

According to a further embodiment of the method, for the modifying of the physical and/or chemical nature of the surface section for providing the activated surface section, the sample or the deposition unit is microstructured in the surface section.

The modifying of the physical and/or chemical nature here comprises in particular modifying the geometry of the surface section.

Microstructuring, is understood in the present case in particular to mean that the surface is not flat and smooth, that is to say does not have an extremely low surface roughness, but instead has a structure. In this case, the structure may be unordered and microscopic, such as for example what is known as "nanograss" on silicon. However, a particular geometric structure may also be provided, such as individual trenches or elevated structures and/or columns, which are for example producible by embossing lithography methods.

An advantage of such microstructured surfaces is that these provide for example partial surfaces having a variety of orientations and/or edges, so that contact with the particle can always be made irrespective of where the particle is adhering on the measuring tip. In addition, a contact surface between the particle and the microstructured surface can be enlarged compared to a smooth surface. If the particle for example has a spherical shape, then it only has a single contact area on a smooth surface. In contrast, two contact areas are possible in a V-shaped trench or in a corner of an elevated structure. In addition, the particle can be wiped off at an edge of the microstructure.

The microstructure can be produced in particular in situ by use of particle beam-induced processes. An etching process in which material is removed or a deposition process in which material is deposited may be used here. As a result of the etching, for example, a surface having high surface energy and/or high chemical reactivity can be exposed. As a result of the deposition, for example, a surface having high surface energy and/or high chemical reactivity can be produced.

The microstructure can also be generated externally to the apparatus with which the method is conducted. The already microstructured surface may then also additionally be activated for example as described above.

According to a further embodiment of the method, the sample or the deposition unit is subjected to a chemical pretreatment for providing a functionalized surface.

The chemical pretreatment may include activating the surface. However, the chemical pretreatment may also be effected prior to the activating of the surface. The pretreatment can in particular be conducted externally to the apparatus with which the method is carried out.

Specifically, when the material is silicon, it may be provided that the surface section to be activated is passivated with hydrogen. This may for example be done by use of treatment of the silicon with hydrofluoric acid (HF). The native oxide layer is dissolved during this pretreatment and the exposed bare silicon binds a monolayer of hydrogen atoms on its surface. It may also be said that the silicon is saturated with hydrogen. As a result of the hydrogen layer, contact of air molecules with the bare silicon is prevented, for which reason the formation of a passivated layer, in particular of the native oxide layer, is prevented for a certain amount of time. However, the bonding of the hydrogen atoms to the silicon is only weak, meaning that the hydrogen atoms can for example be detached by irradiating with an electron beam.

Alternatively to this hydrogen passivation, other surface functionalizations may be provided. A further example of a functionalization is the attachment or grafting ("tethering") of molecule chains, in particular functionalized polymers, to the passivated surface. The functionalized polymers here for example have activatable end groups or side groups. The activatable groups may for example be activated by irradiating with light of a specific wavelength. Further examples of functionalized surfaces are self-assembled monolayers or polymer brushes, various polymers, in particular copolymers, being able to be used.

Functionalized surface layers can additionally have an advantage when a nature, in particular a chemical composition, of the particles that are to be removed from the sample surface is known. It may be sufficient here if it is known that a particular element is present on the surface of the particle. A functionalized surface layer may then be formed which reacts with the element in a specific chemical reaction. For example, the functionalized surface has particular chemical groups which can react in a corresponding specific chemical reaction.

According to a further embodiment of the method, the sample or the deposition unit includes a material selected from the group comprising silicon, silicon carbide, tungsten, tungsten carbide, cobalt, carbon, indium and platiniridium.

According to a further embodiment of the method, a crystal lattice of the material of the surface section to be activated has an orientation in which a surface energy is maximized.

For a silicon surface, for example, a (110) surface or a (111) surface is preferred. "(110)" and "(111)" are Miller indices and denote a particular crystal plane.

According to a further embodiment of the method, the deposition of the particle on the activated surface section comprises wiping off the particle by way of a movement of the measuring tip relative to the sample or the deposition unit.

"Wiping off" is for example understood in the present case as meaning that, when the particle is in contact with the activated surface, a "wiping" movement is carried out with the measuring tip. To this end, in particular, an edge of a microstructure on the surface which "blocks" the particle is suitable. The particle gets caught on the edge while the measuring tip moves. As a result of this, the particle is displaced on the measuring tip, in particular up to the free end of the measuring tip. This can for example achieve a situation in which the bonding force of the particle to the tip is smaller than the bonding force to the sample surface.

The wiping movement of the measuring tip may in this case not only include movements along linear trajectories, but also movements along curved trajectories, so that a curved movement is produced. In addition, the measuring tip during the wiping may additionally be rotated about at least one axis of rotation so that, for example, a point on the surface of the measuring tip describes a helical path or the like in space.

According to a further embodiment of the method, the measuring tip is heated, irradiated and/or electrically charged for the transferring of the particle.

These measures may be suitable for reducing the bonding strength of the particle to the measuring tip and hence for promoting the transferring of the particle to the activated surface section.

According to a further embodiment of the method, the activated surface section is heated, irradiated and/or electrically charged for the transferring of the particle and/or directly after the transferring of the particle.

These measures may firstly promote the transferring of the particle to the activated surface section. Secondly, an activation energy may for example be provided in this way which serves for activating a chemical reaction to form chemical bonds between the particle and the activated surface.

In embodiments, the particle is fused on the activated surface.

In further embodiments, the particle can be anchored on the activated surface by use of a particle beam-induced deposition process. To this end, for example, a suitable process gas is supplied which can be converted into a reactive species by irradiating with a particle beam, in particular with an electron beam, this reactive species chemically reacting with the activated surface and the particle and bonding the latter to the surface in the process. This ensures that the particle is durably attached to the surface.

According to a further embodiment of the method, the sample and the processing arrangement or the sample, the processing arrangement and the deposition unit are arranged in a vacuum housing, wherein the modifying of a physical and/or chemical nature of the surface section of the sample or of the deposition unit is effected in situ, that is to say in particular without removing or breaking the vacuum.

"In situ" is understood for example to mean that the sample or the deposition unit is not removed from the vacuum housing and then reintroduced. That the vacuum is not removed or broken is for example understood to mean that the vacuum in the vacuum housing is maintained, in particular is maintained unchanged. For example, a residual gas pressure in the vacuum housing remains essentially constant in this case.

According to a further embodiment of the method, the taking up of the particle with the measuring tip and the transferring of the particle to the activated surface section are monitored with a microscope, in particular with an electron microscope such as a scanning electron microscope.

The microscope can also be used to monitor the taking up and the transferring of the particle. It can be ensured by this that the particle has been completely removed from the sample surface and also has been completely transferred from the measuring tip to the activated surface.

In embodiments, the processed sample surface and/or activated surface are scanned with the scanning electron microscope and thus in particular an image of the respective surface is captured, on the basis of which image the state of the respective surface can be determined.

According to a further embodiment of the method, the particle adsorbed on the activated surface section is analysed in situ with a particle beam.

"In situ" is for example understood in the present case to mean that the sample or the deposition unit with the particle adsorbed on the activated surface section are not brought into an external apparatus. Where the method is conducted under vacuum in a vacuum housing, the vacuum is not broken.

The analysis may in particular comprise spectroscopy. In this case, for example, molecular and/or atomic states of the substances present in the particle are excited and their energy is measured. Examples of spectroscopy include atomic fluorescence spectroscopy, electron spectroscopy, such as Auger electron spectroscopy (AES), X-ray photo-electron spectroscopy (XPS) and/or electron energy loss spectroscopy (EELS), X-ray spectroscopy, such as energy-dispersive X-ray spectroscopy (EDX), mass spectroscopy, emission spectroscopy, absorption spectroscopy, infrared spectroscopy, Raman spectroscopy, micro-Raman spectros-copy, and the like. In addition, an atom probe, in particular a tomographic atom probe (atom probe tomography, APT) may be used to analyze the particle, and also a field-emission microscope (FEM) or else a field ion microscope (FIM).

By use of the spectroscopy, it is for example possible to draw conclusions concerning a chemical composition of the particle and also for example a crystal structure and the like. Based on this, a suitable measuring tip may for example be selected, with which particles of this type are taken up particularly well. In addition, the activated surface section or the deposition unit may be selected and/or optimized taking into consideration the type of particle, so that the particle can be efficiently transferred from the measuring tip to the deposition unit. Information concerning the particle obtained by the analysis may moreover be helpful for improving a production process, for example of the lithog-raphy mask, as a whole. For example, it can be determined in which processing step a particularly large number of particles end up on the sample surface, which particles subsequently have to be removed again.

In accordance with a fifth aspect, an apparatus for ana-lyzing and/or processing a sample with the aid of a process-ing arrangement is proposed. The apparatus comprises a processing arrangement comprising a measuring tip for taking up a particle adhering on a sample surface of the sample and an activation unit for modifying a physical and/or chemical nature of a surface section on the sample or on a deposition unit for providing an activated surface section. Further provided is a movement unit which is configured to move the measuring tip into an interaction region of the activated surface section in which an attractive interaction acts between the particle taken up by the mea-suring tip and the activated surface section in order to transfer the particle taken up from the measuring tip to the activated surface section.

The embodiments and features described for the proposed method according to the fourth aspect are correspondingly applicable to the proposed apparatus and vice versa. The apparatus further has the advantages described with refer-ence to the method.

The method according to the fourth aspect is preferably conducted with an apparatus according to the fifth aspect.

According to an embodiment of the apparatus, the acti-vation unit comprises a laser, a flash lamp, an electric circuit, an ion beam providing unit and/or an electron beam pro-viding unit.

According to a further embodiment of the apparatus, the apparatus comprises a vacuum housing in which the pro-cessing arrangement and the activation unit are arranged. The sample and possibly the deposition unit can be brought into the vacuum housing for example by use of an airlock. The apparatus preferably has a sample stage arranged in the vacuum housing for holding the sample while the method is conducted. The sample stage may also be configured for holding the deposition unit. The sample stage is in particular mechanically decoupled from the vacuum housing.

According to a further embodiment of the apparatus, the apparatus comprises an electron microscope. The electron microscope is configured for capturing an image of the sample, of the measuring tip, of the deposition unit and/or of the particle, when the latter is disposed on the sample surface, on the measuring tip and/or on the activated surface section.

The electron microscope simultaneously constitutes an electron beam providing unit. The electron microscope is in particular configured for capturing an image of the sample, of the deposition unit and/or of the measuring tip. It may be a scanning electron microscope (SEM). The positioning of the measuring tip can therefore be tracked in real time, for example.

According to a further embodiment of the apparatus, the apparatus comprises a process gas providing unit.

The process gas providing unit can advantageously be configured for supplying a process gas which can be used for conducting a particle beam-induced processing process, in particular an etching process or a deposition process. The process gas can in particular comprise a mixture of two or more process gases. With the apparatus, it is possible in particular here to generate on the surface of the sample and/or of the deposition unit microstructures which promote the transferring of the particle.

Appropriate process gases suitable for depositing material or for growing elevated structures are, in particular, alkyl compounds of main group elements, metals or transition elements. Examples thereof are (cyclopentadienyl)trimethylplatinum $CpPtMe_3$ ($Me=CH_4$), (methylcyclopentadienyl)trimethylplatinum $MeCpPtMe_3$, tetramethyltin $SnMe_4$, trimethylgallium $GaMe_3$, ferrocene $Cp_2Fe$, bis-arylchromium $Ar_2Cr$, and/or carbonyl compounds of main group elements, metals or transition elements, such as, for example, chromium hexacarbonyl $Cr(CO)_6$, molybdenum hexacarbonyl $Mo(CO)_6$, tungsten hexacarbonyl $W(CO)_6$, dicobalt octacarbonyl $Co_2(CO)_8$, triruthenium dodecacarbonyl $Ru_3(CO)_{12}$, iron pentacarbonyl $Fe(CO)_5$, and/or alkoxide compounds of main group elements, metals or transition elements, such as, for example, tetraethyl orthosilicate $Si(OC_2H_5)_4$, tetraisopropoxytitanium $Ti(OC_3H_7)_4$, and/or halide compounds of main group elements, metals or transition elements, such as, for example, tungsten hexafluoride $WF_6$, tungsten hexachloride $WCl_6$, titanium tetrachloride $TiCl_4$, boron trifluoride $BF_3$, silicon tetrachloride $SiCl_4$, and/or complexes comprising main group elements, metals or transition elements, such as, for example, copper bis(hexafluoroacetylacetonate) $Cu(C_5F_6HO_2)_2$, dimethylgold trifluoroacetylacetonate $Me_2Au(C_5F_3H_4O_2)$, and/or organic compounds such as carbon monoxide $CO$, carbon dioxide $CO_2$, aliphatic and/or aromatic hydrocarbons, and the like.

Appropriate process gases suitable for etching material are for example: xenon difluoride $XeF_2$, xenon dichloride $XeCl_2$, xenon tetrachloride $XeCl_4$, water vapour $H_2O$, heavy water $D_2O$, oxygen $O_2$, ozone $O_3$, ammonia $NH_3$, nitrosyl chloride $NOCl$ and/or one of the following halide compounds: $XNO$, $XONO_2$, $X_2O$, $XO_2$, $X_2O_2$, $X_2O_4$, $X_2O_6$, where X is a halide. Further process gases for etching material are specified in the present applicant's U.S. patent application Ser. No. 13/103,281.

Additional gases, which can for example be added in proportions to the process gas in order to better control the processing process, comprise for example oxidizing gases such as hydrogen peroxide $H_2O_2$, nitrous oxide $N_2O$, nitrogen oxide $NO$, nitrogen dioxide $NO_2$, nitric acid $HNO_3$ and other oxygen-containing gases, and/or halides such as chlorine $Cl_7$, hydrogen chloride $HCl$, hydrogen fluoride $HF$, iodine $I_2$, hydrogen iodide $HI$, bromine $Br_2$, hydrogen bromide $HBr$, phosphorus trichloride $PCl_3$, phosphorus pentachloride $PCl_5$, phosphorus trifluoride $PF_3$ and other halogen-containing gases, and/or reducing gases, such as hydrogen $H_2$, ammonia $NH_3$, methane $CH_4$ and other hydrogen-containing gases. Said additional gases can be used for example for etching processes, as buffer gases, as passivating media and the like.

In accordance with a sixth aspect, a method for processing a sample with a processing arrangement is proposed. In a first step, a particle adhering on a sample surface of the sample is taken up with a measuring tip of the processing arrangement. In a second step, the measuring tip is physicochemically treated so that the particle is anchored on the measuring tip.

This method has the advantage that the particle is durably bonded with the measuring tip. The measuring tip can therefore be reused without the risk of the particle being transferred from the measuring tip back onto the sample surface or falling off from the measuring tip.

The embodiments and features described for the proposed method according to the fourth aspect and the apparatus according to the fifth aspect are correspondingly applicable to the proposed method according to the sixth aspect and vice versa.

According to an embodiment of the method, the physicochemical treatment comprises heating the measuring tip so that the particle is fused to the measuring tip. The fusing results in particular in an increase in a contact surface between the particle and the measuring tip, as a result of which the bond becomes stronger.

The measuring tip may be heated in various ways. Preference is given to irradiating the measuring tip with radiation energy, such as for example laser radiation or focused infrared radiation. This can be done in a targeted manner in particular.

Alternatively, there may be provision to heat the measuring tip by use of a flow of current through the measuring tip. Suitable for this purpose in particular is electron bombardment heating in which a thermionic cathode is used to emit thermal electrons which are accelerated onto the measuring tip by applying a voltage between the measuring tip and the thermionic cathode. On impact of the electrons on the measuring tip, the electrons deliver a large portion of their kinetic energy to the measuring tip in the form of thermal energy.

This method for fusing the particle to the measuring tip may be advantageous in particular in the case of metallic particles, such as for example tin.

According to a further embodiment of the method, the physicochemical treatment comprises anchoring of the particle by use of a particle beam-induced deposition process. To this end, for example, a suitable process gas is supplied which can be converted into a reactive species by irradiating with a particle beam, in particular with an electron beam, this reactive species chemically reacting with the surface of the measuring tip and the particle and bonding the latter to the surface in the process. This ensures that the particle is durably attached to the surface of the measuring tip.

According to a further embodiment of the method, before it is anchored on the measuring tip, the particle is displaced to a position on the measuring tip at which it is not a disturbance for further processing steps.

In particular, the particle is displaced from a free end of the measuring tip along the measuring tip in the direction of the cantilever. The displacing can be effected, for example, by use of a wiping movement against a fixed structure, in particular an edge or the like.

In accordance with a seventh aspect, a method for processing a sample with a processing arrangement is proposed. In a first step, a particle adhering on a sample surface of the sample is taken up with a measuring tip of the processing arrangement. In a second step, a process gas is supplied to a processing position on the sample or on a deposition unit. In a third step, a particle beam is irradiated onto the processing position in order to trigger a local chemical reaction by means of which a microstructure is generated at the processing position. In a fourth step, the measuring tip is moved into an interaction region of the generated microstructure in which an interaction exists between the particle taken up by the measuring tip and the generated microstructure in order to transfer the particle from the measuring tip to the generated microstructure.

The embodiments and features described for the proposed method according to the fourth aspect, the apparatus according to the fifth aspect and the method according to the sixth aspect are correspondingly applicable to the proposed method according to the seventh aspect and vice versa.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the invention also comprise not explicitly mentioned combinations of features or embodiments that are described above or below with respect to the exemplary embodiments. In this case, a person skilled in the art will also add individual aspects as improvements or supplementations to the respective basic form of the invention.

BRIEF DESCRIPTION OF DRAWINGS

Further advantageous configurations and aspects of the invention are the subject matter of the dependent claims and also of the exemplary embodiments of the invention described below. In the text that follows, the invention is explained in more detail on the basis of preferred embodiments with reference to the accompanying figures.

FIG. 2 shows three schematic images of an exemplary embodiment for the modifying of a physical and/or chemical nature of a surface section of a deposition unit;

FIG. 3 schematically shows an exemplary embodiment for the modifying of a physical and/or chemical nature of a surface section of a sample;

FIG. 4 shows three schematic images of a further exemplary embodiment for the modifying of a physical and/or chemical nature of a surface section of a deposition unit;

DETAILED DESCRIPTION

Unless indicated to the contrary, elements that are the same or functionally the same have been provided with the same reference signs in the figures. It should also be noted that the illustrations in the figures are not necessarily true to scale.

Figure 1:
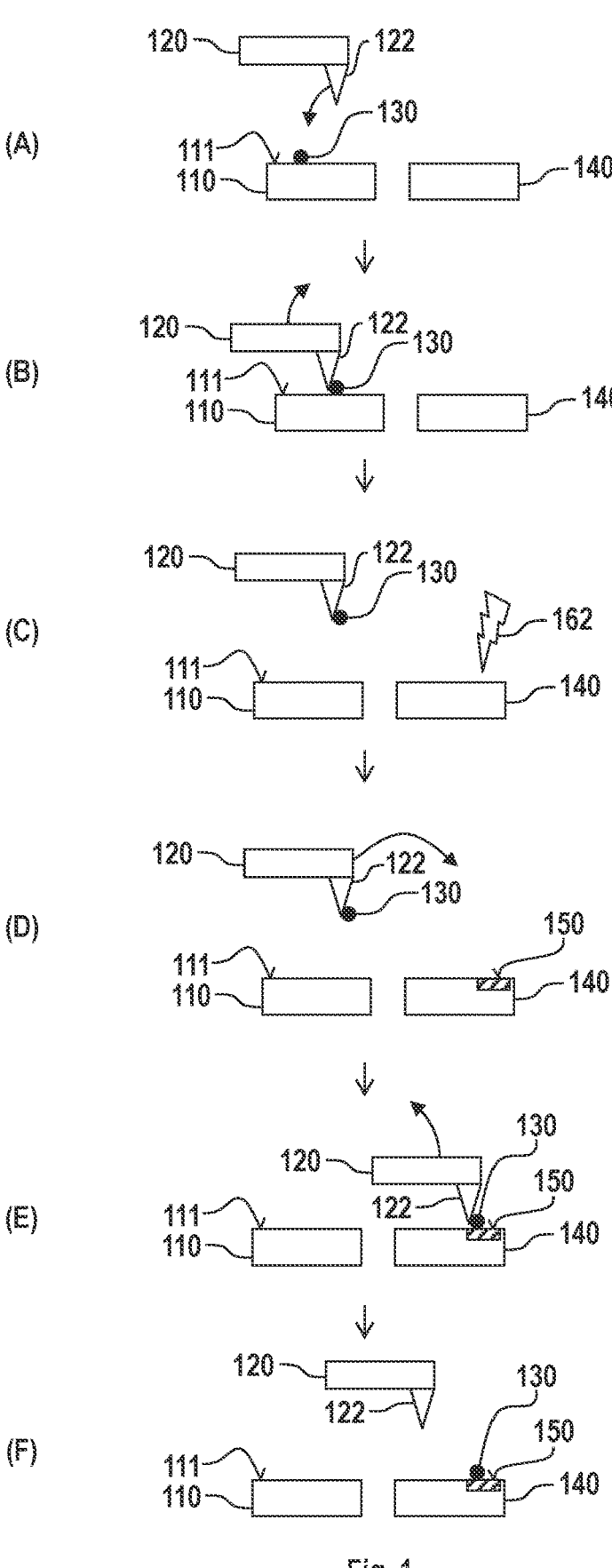
FIG. 1 shows six schematic images (A)-(F) of an exemplary embodiment for the removal of a particle from a sample by use of a processing arrangement.

FIG. 1 shows six schematic images (A)-(F) of an exemplary embodiment for the removal of a particle 130 from a sample 110 by use of a processing arrangement 120 taking the form of an atomic force microscope. The sample 110 is for example a microlithographic lithography mask.

Image (A) of FIG. 1 shows the initial situation, in which the particle 130 is adsorbed on the sample surface 111 of the sample 110. In this example, a deposition unit 140 is arranged next to the sample 110. The deposition unit 140 in particular has a passivated surface which is not very reactive and has a low surface energy. The atomic force microscope 120 with a measuring tip 122, which here is made from carbon, is located above the sample 110.

The atomic force microscope 120 moves the measuring tip 122, for example using a microactuator (not shown), to the particle 130 on the sample surface 111. Image (B) of FIG. 1 shows how the measuring tip 122 makes contact with the particle 130. The particle 130 is taken up by the measuring tip 122, that is to say it detaches from the sample surface 111 and adheres to the measuring tip 122. A supportive pivoting movement may for example be carried out with the measuring tip 122 to this end.

The measuring tip 122 with the adhering particle 130 is moved away from the sample 110, as is shown in image (C) of FIG. 1. The particle 130 is thus removed from the sample surface 111. In order to transfer the particle 130 from the measuring tip 122 to the deposition unit 140, it is advantageous to modify the passivated surface of the deposition unit 140.

Image (C) of FIG. 1 shows that energy 162 is supplied to the deposition unit 140, for example by an activation unit 160 (see FIG. 2, 4, 5 or 10). The energy 162 brings about a modification of the physical and/or chemical nature of a surface section of the deposition unit 140. By way of example, in this case a passivation layer 141 (see FIG. 2) located on the surface of the deposition unit 140 is removed in the surface section. In this way, an activated surface section 150 is provided, as shown in image (D) of FIG. 1. In further embodiments, a microstructure 140a, 140b, 140c (see FIG. 6) can be generated on the surface by the activation unit 160.

The measuring tip 122 with the taken-up particle 130 is brought into an interaction region of the activated surface section 150. This is illustrated in image (E) of FIG. 1. In this example, the particle 130 is brought into contact with the activated surface section 150. The particle 130 now adsorbs on the activated surface section 150 since this has a high surface energy and/or chemically reacts with atoms of the particle 130, as a result of which the adhesive effect of the particle 130 on the measuring tip 122 is advantageously overcome. The particle 130 is thus transferred from the measuring tip 122 to the activated surface section 150.

Image (F) of FIG. 1 shows the target state in which the particle 130 adheres to the activated surface section 150 and the sample 110 on the one hand and the measuring tip 122 on the other are free of particles 130. The measuring tip 122 can now be used to take up and transfer a further particle 130.

It should be noted that, alternatively to the deposition unit 140, there may also be provision to provide the activated surface section 150 in a suitable region on the sample 110, as is described by way of example with reference to FIG. 3.

FIG. 2 shows three schematic images of an exemplary embodiment for the modifying of a physical and/or chemical nature of a surface section of a deposition unit 140. In this example, this is in particular a deposition unit 140 composed of silicon. The silicon surface has a (110) orientation. The illustrated deposition unit 140 can be used for example as described with reference to FIG. 1.

Image (A) of FIG. 2 shows the deposition unit 140 with passivation layer 141 located on the surface, this passivation layer 141 for example being a native oxide layer produced by spontaneous oxidation. The passivation layer 141 is not very reactive and has a low surface energy, for which reason it is of little suitability for adsorbing a particle thereon.

In image (B) of FIG. 2, an activation unit 160 is illustrated which in this example takes the form of a laser. The laser 160 irradiates a laser beam 162 (an example of the supplying of energy) onto the surface section to be activated. The laser beam 162 is absorbed by the passivation layer 141, as a result of which the latter heats up strongly, which leads to the sublimation of atoms of the passivation layer 141. This is represented by the desorbed material 142. Depending on the thickness of the passivation layer 141, more or less material must be removed until the bare silicon of the deposition unit 140 is revealed.

After completion of the activation process, shown here in image (C) of FIG. 2, the passivation layer 141 has been completely removed in the activated surface section 150, so that the bare silicon of the deposition unit 140 is accessible from above. The bare silicon surface has a universal reactivity, that is to say it can chemically react with a great many different elements and form stable chemical bonds therewith. For instance, silicon forms stable bonds with carbon, oxygen, nitrogen and a plurality of metals. This can be used to easily transfer a particle 130 (see FIG. 1 or 7-9) from a measuring tip 122 (see FIG. 1 or 7-9) to the activated surface section 150 and to bond it there firmly to the deposition unit 140.

FIG. 3 schematically shows an exemplary embodiment for the modifying of a physical and/or chemical nature of a surface section of a sample 110. The sample 110 is for example a lithography mask which has a microstructure on its surface. In this example, the microstructure is formed by free regions 111 and coated regions 112. For the function of the lithography mask 110, for example, the free regions 111 must be free of particles 130 (see FIG. 1 or 7-9), but the nature of the coated regions 112 is essentially irrelevant. Therefore, a particle 130 may be present on the layer 112 without impairing the function.

A separate deposition unit 140 (see FIGS. 1, 2 and 4-10) can therefore be dispensed with. Instead, a surface section 150 of the layer 112 is activated by a suitable supply of energy 162. A prerequisite for this is that the sample 110 has a suitable layer 112 on its surface. The activation can for example be effected by use of laser, an ion beam or else an electron beam.

FIG. 4 shows three schematic images of a further exemplary embodiment for the modifying of a physical and/or chemical nature of a surface section of a deposition unit 140. In this example, this is in particular a deposition unit 140 composed of silicon. The silicon surface has a (110) orientation. The illustrated deposition unit 140 can be used for example as described with reference to FIG. 1.

Image (A) of FIG. 4 shows the deposition unit 140 with a passivation layer 141 on its surface. It additionally schematically shows an electrical circuit 160 with a power source 164 and a switch 166. The deposition unit 140 is integrated into the electrical circuit 160. The electrical circuit 160 in this example forms the activation unit 160.

When the switch 166 is closed, as is shown in image (B) of FIG. 4, a current I flows through the deposition unit 140. As a result, the deposition unit 140 is heated substantially as a whole. The deposition unit 140 is heated so strongly that the passivation layer 141 decomposes and vaporizes 142. When the switch 166 is opened again, as shown in image (C) of FIG. 4, the whole surface of the deposition unit 140 has been activated, that is to say the activated surface section 150 encompasses the entire surface.

If the reactivity of the activated surface 150 decreases, the process can simply be repeated. In the process, particles 130 that have already adsorbed on the activated surface 150 (see FIG. 1 or 7-9) are also vaporized and the deposition unit 140 is thus cleaned.

Figure 5:
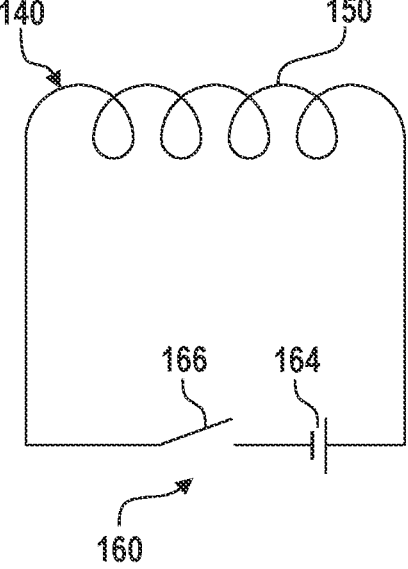
FIG. 5 schematically shows an exemplary embodiment of a deposition unit.

FIG. 5 schematically shows an exemplary embodiment of a deposition unit 140 which in this example takes the form of a coiled filament made from tungsten. This can be heated particularly easily and with a comparatively low current to the extent that any contamination on the surface of the coiled filament 140 vaporizes without the coiled filament 140 itself being damaged in the process. It is additionally advantageous that the coiled filament 140 provides surfaces having different orientation and is additionally self-supporting, thus a position can always be found with the measuring tip 122 (see FIG. 1 or 7-9) in which the particle 130 (see FIG. 1 or 7-9) can be brought into contact with the coiled filament 140.

For providing the activated surface 150, the coiled filament 140 is integrated into a circuit 160 which includes a power source 164 and a switch 166. When the switch 166 is closed, a current flows through the coiled filament 140. The illustrated deposition unit 140 can be used for example as described with reference to FIG. 1.

Alternatively to tungsten, the coiled filament 140 can for example also be produced from platiniridium. This may be advantageous when for example xenon difluoride $XeF_2$ is present in the process atmosphere, since this molecule spontaneously reacts with tungsten. An incandescent wire 140 made from platiniridium in this case has a relatively high lifetime.

Figure 6A:
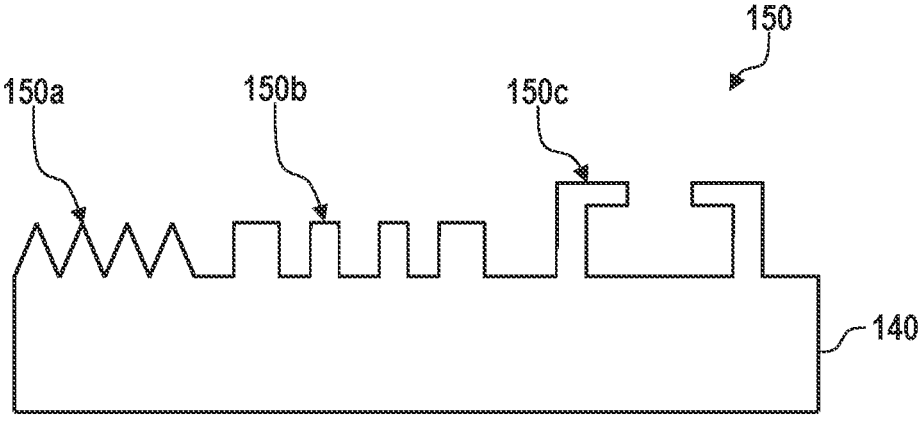
FIGS. 6A-6G schematically show different exemplary embodiments for microstructured surface sections.

FIG. 6A schematically shows an exemplary embodiment of a deposition unit 140 having microstructured surface 150. In this example, the deposition unit has three different types of microstructures 150a, 150b, 150c. It should be noted that the deposition unit 140 may have exactly one type of microstructure over the entire surface, may have one type of microstructure only in a surface section, or else may have different types of microstructures in different surface sections, as illustrated in FIG. 6A. The illustrated deposition unit 140 can be used for example as described with reference to FIG. 1. The microstructured surface 150 in this example forms the activated surface section 150. In particular, the microstructured surface section 150 is suitable for the transferring of the particle 130 even without an additional activation by an activation unit 160.

The left-hand microstructure 150a has a sawtooth profile or zigzag profile in cross section. In three dimensions, it may be a comb-like structure (see also FIG. 6B or 6C) or else pyramids arranged on the surface (the pyramid structure is formed for example in that a first comb-like sawtooth profile has superposed on it a second comb-like sawtooth profile rotated by 90°). As a result of the oblique sides of this structure in relation to a horizontal or vertical direction, the measuring tip 122 (see FIG. 1 or 7-9) may for example be positioned such that a side of the measuring tip 122 extends parallel to a side of the microstructure 150a. It is thus ensured, when the measuring tip 120 is approaching the surface, that the particle 130 (see FIGS. 1 and 7-9) is the first to come into contact with the surface.

The middle microstructure 150b has a rectangular profile in cross section. In three dimensions, this may be a comb-like structure or else a chequerboard structure or individual, free-standing columns. The columns may preferably have a round cross section. This microstructure 150b is easy to produce and provides edges at which the particle 130 can be wiped off. The wiping off of a particle 130 is described for example with reference to FIG. 7.

The right-hand microstructure 150c has a hook-shaped profile in cross section. The hook-shaped profile in particular has an overhang. The measuring tip 122 can be positioned such that the measuring tip 122 extends into a spatial region below the overhang (see FIG. 7). A wiping off of the particle 130 from the measuring tip 122 can thus advantageously be carried out, as is described below with reference to FIG. 7.

Figure 10:
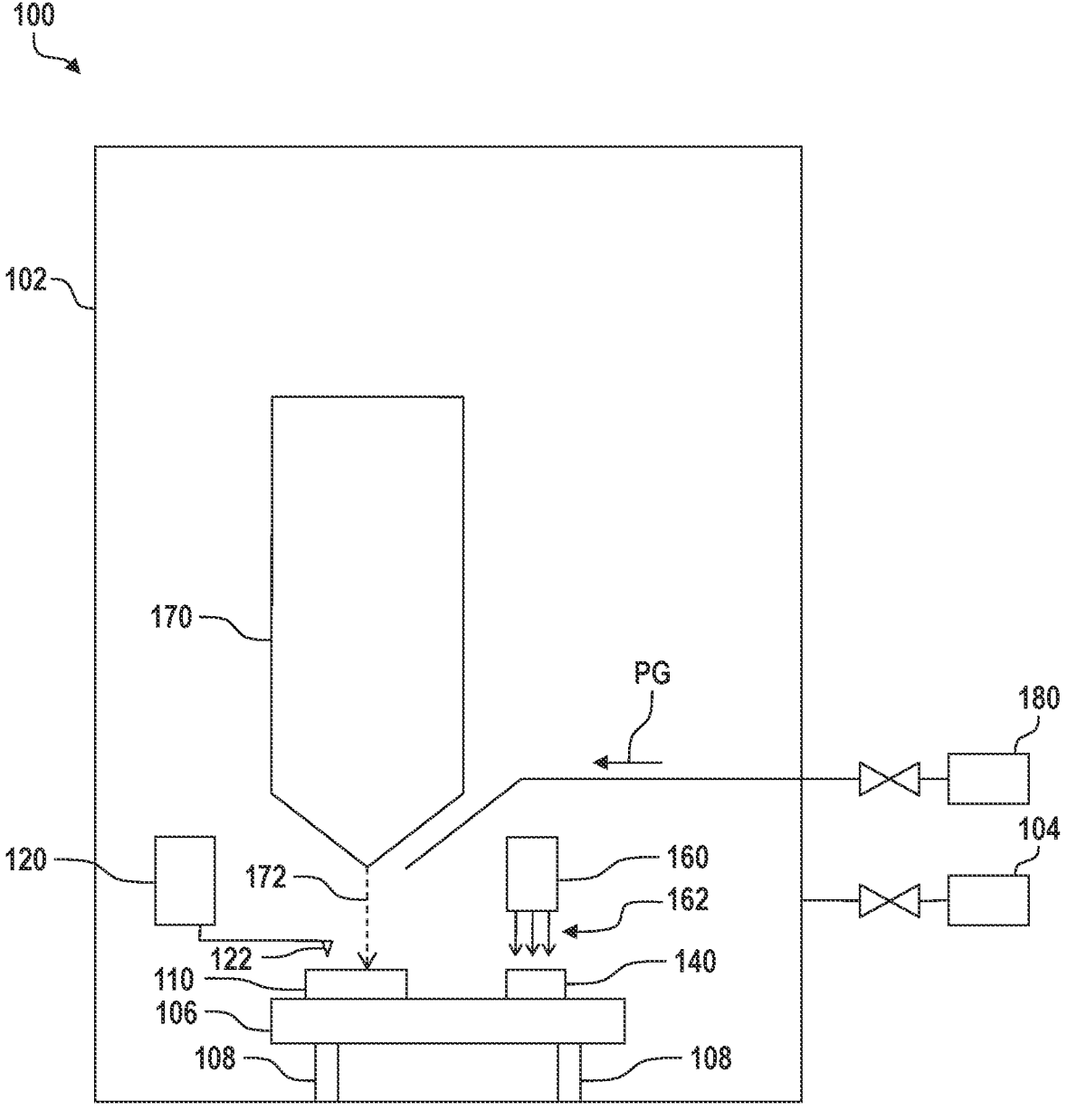
FIG. 10 schematically shows an exemplary embodiment of an apparatus for analyzing and/or processing a sample.

The respective microstructure 150a, 150b, 150c can in particular be generated (not illustrated) by a particle beam-induced etching and/or deposition process using a suitable process gas PG (see FIG. 10).

It should be noted that the use of a microstructure 150a, 150b, 150c is particularly advantageous for enlarging a contact surface of the particle 130 with the surface of the deposition unit 140. This promotes the transferring of particles 130 from the measuring tip 122 to the deposition unit 140. In embodiments, when using a microstructured deposition unit 140, an additional activation of the surface can therefore be dispensed with in the sense that a surface energy is increased and/or a chemical reactivity is increased.

Figure 9:
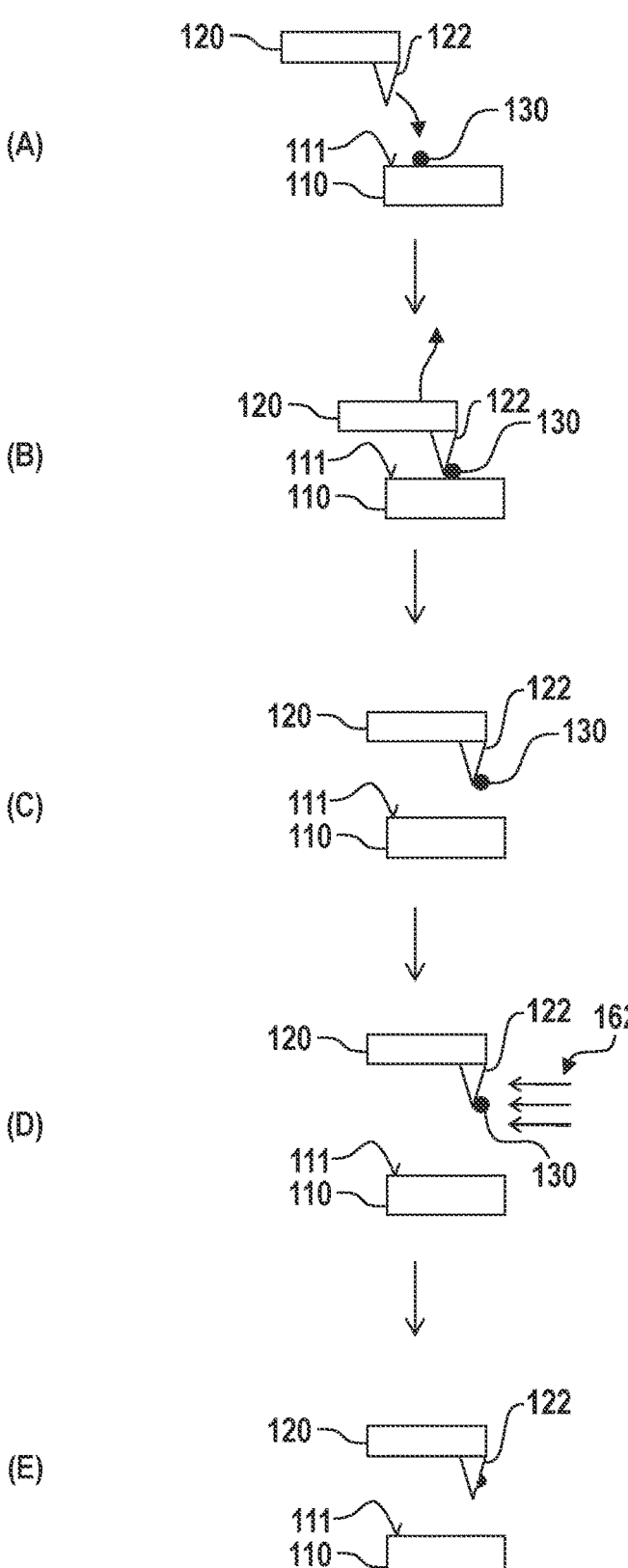
FIG. 9 shows five schematic images (A)-(F) of a further exemplary embodiment for the removal of a particle from a sample by use of a processing arrangement.

The microstructured surface 150, alternatively to FIG. 6A, may also be present and/or generated (not illustrated) on the sample surface 111 (see FIG. 1, 3 or 9).

Figure 6B:
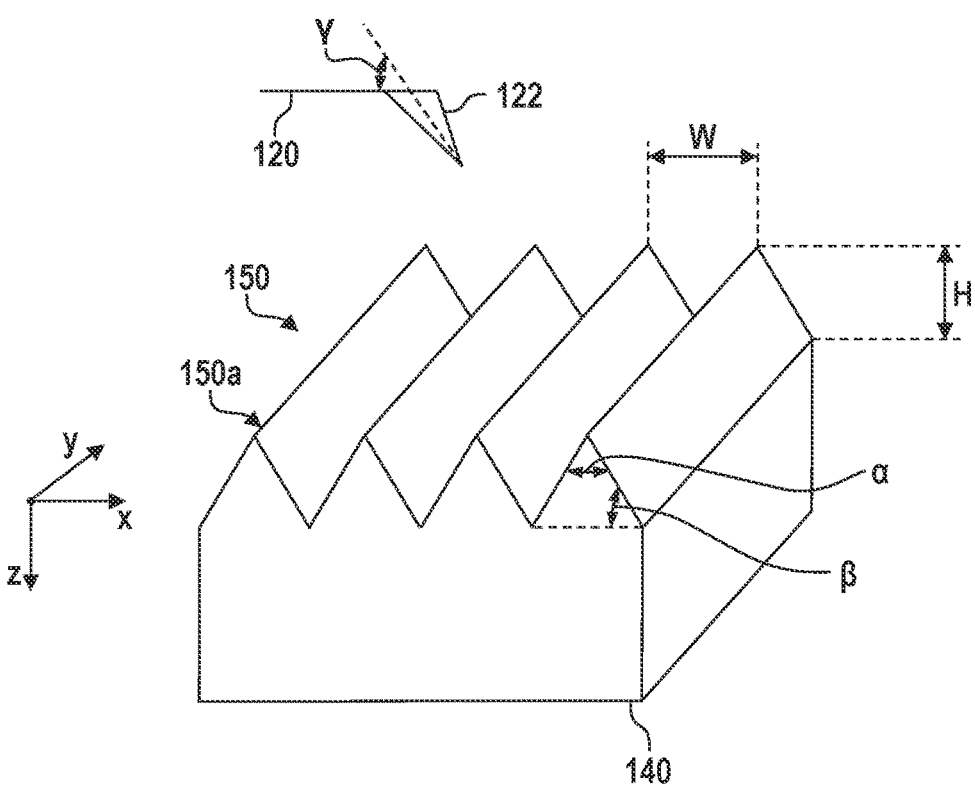
Figure 6C:
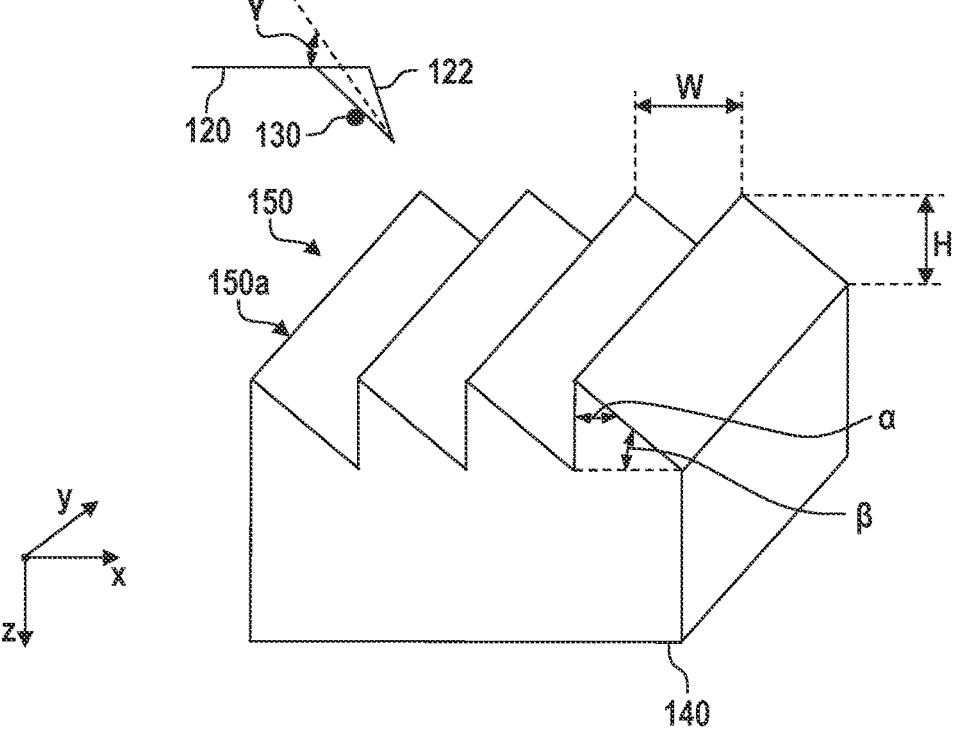

FIGS. 6B and 6C each show a further exemplary embodiment for a microstructured surface section 150 on a deposition unit 140. In these examples, this is a periodic microstructure 150a, the cross section of which has a zigzag profile (FIG. 6B) and a sawtooth profile (FIG. 6C).

The cross section lies in a cross-sectional plane which in this example corresponds to the x-z plane of the illustrated coordinate system. The cross-sectional plane in this case in particular is perpendicular to a main plane of extent of the deposition unit 140, which in this example lies in the x-y plane. The microstructure 150a is periodic here only in one direction (x direction) and is constant in a direction perpendicular thereto (y direction). That is to say that a cross section of the microstructure 150a in a cross-sectional plane that corresponds to the y-z plane is constant, or essentially constant, for every x position, this not ruling out certain manufacturing tolerances.

The respective microstructure 150a is defined by in each case four structure parameters in these examples. These are a height H of the individual teeth, a spacing W between two teeth (which can also be expressed as the spatial periodicity or spatial frequency), a first angle $\alpha$ and a second angle $\beta$. The height H is for example in a range between 1 nm-10 μm and the spacing W is for example in a range between 10 nm-100 μm.

Variations in individual or all of these structure parameters can be used to provide further microstructures having in part different properties and/or different suitability for the wiping off of particles. For instance, the two structures of FIGS. 6B and 6C for example differ only in the angle $\alpha$, or in both angles $\alpha$ and $\beta$ and/or else in the height H and/or the spatial frequency W.

FIGS. 6B and 6C moreover show a measuring tip 122 of the processing arrangement 120. In this example, the measuring tip 122 has an oblique orientation. The orientation of the measuring tip 122 is for example the direction of extent of the measuring tip 122, which in this example is illustrated as a dashed line. The orientation of the measuring tip can in particular be predetermined. That the orientation is oblique is understood in the present case to mean that the plotted angle $\gamma$ is in particular different from 90°. The use of such an oblique measuring tip 122 can be advantageous for taking up a particle 130 from the sample 110. Depending on the value of the angle $\gamma$, a microstructure 150a that is optimally adapted to this angle can be used. In order for example for a particle 130 which is adhering to the underside of the measuring tip 122, as illustrated in FIG. 6C, to be efficiently wiped off on the microstructure 150a, it may be advantageous to select the angle $\beta$ to be equal to or greater than the angle $\gamma$. Contact between the particle 130 and the microstructure 150a can then be made without the particle 130 first being displaced on the measuring tip 122.

Figure 6D:
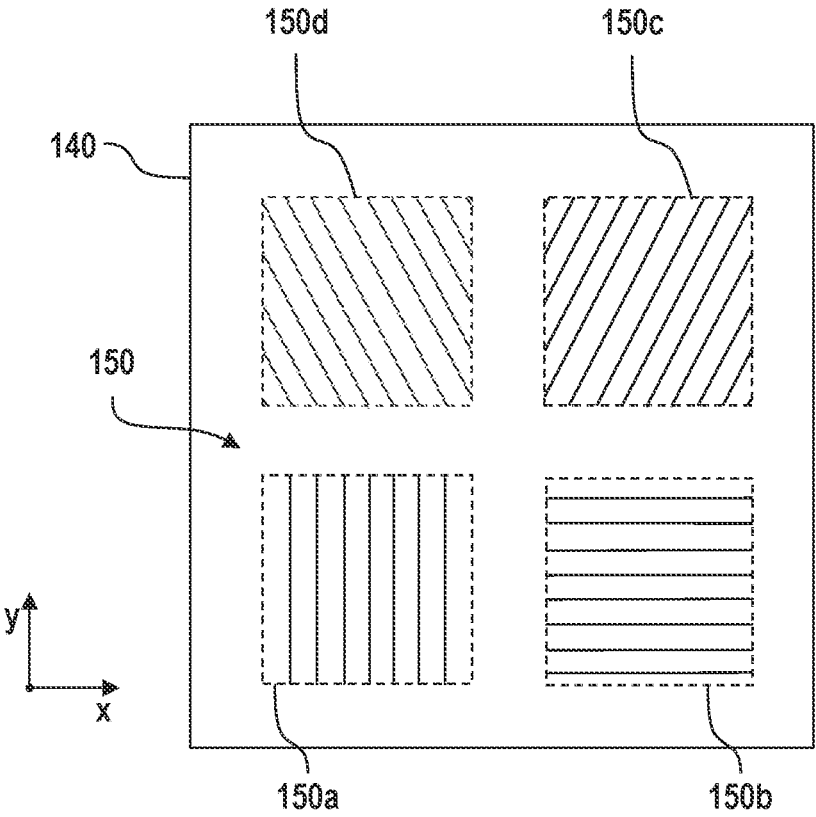

FIG. 6D shows a further exemplary embodiment of a deposition unit 140 having a microstructured surface section 150. In this example, different microstructures 150a-150d are illustrated in four regions. The microstructures 150a-150d for example all have the same cross section but are oriented differently with respect to one another. They for example are the microstructures illustrated in FIG. 6A, 6B or 6C, which here are indicated only by lines, however. By providing the microstructures 150a-150d rotated with respect to one another, edges and surfaces are in particular provided in different orientations for the wiping off of the particle 130 from the measuring tip 122.

Figure 6E:
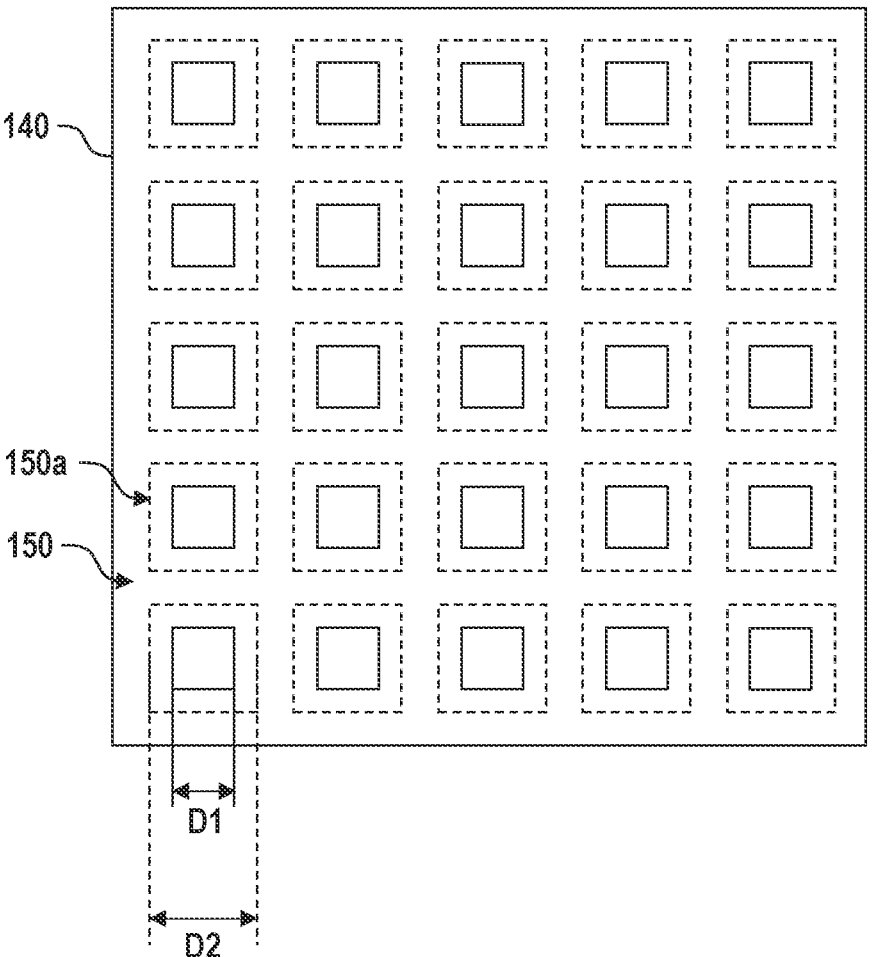

FIG. 6E shows a further exemplary embodiment for a deposition unit 140 having a microstructured surface section 150 with a microstructure 150a which is arranged in repeating fashion so that a cross section through the microstructure 150a has a periodic profile. The microstructure 150a illustrated here is for example formed from rectangular depressions, an overhang being formed at the upper edge of the microstructure 150a. The dashed structure having a width D2 relates for example to a width of the depression beneath the surface of the deposition unit and the continuous structure having a width D1 relates for example to the width of an opening on the surface of the deposition unit 140. A cross section through the microstructure 150a of this example might for example have the appearance as illustrated in FIG. 6A with reference to the structure 150c.

Figure 6F:
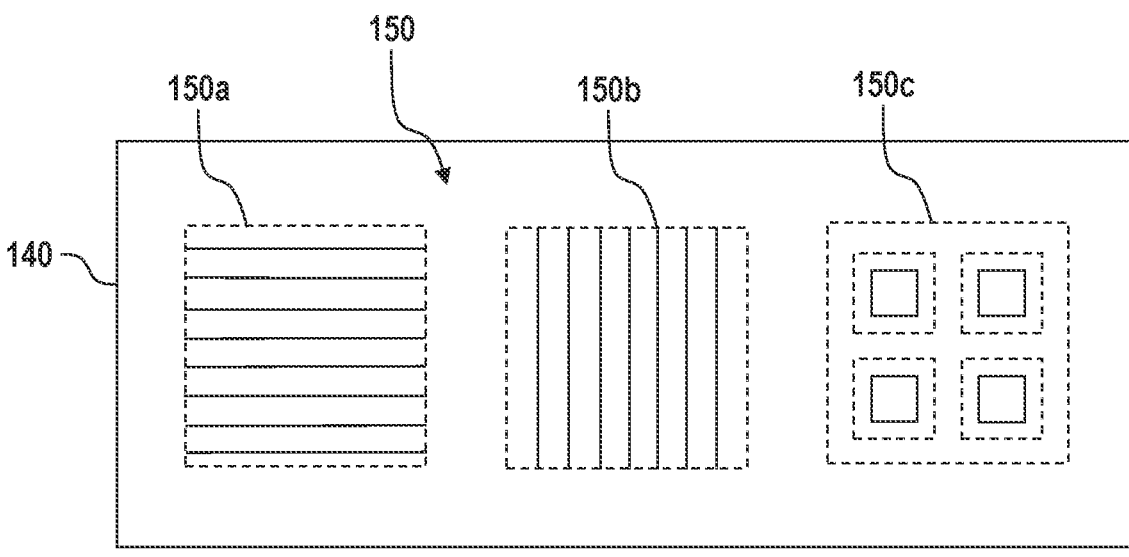

FIG. 6F shows a further exemplary embodiment of a deposition unit 140 having a microstructured surface section 150, the latter comprising three different microstructures 150a-150c in three regions. This for example is a combination of the microstructures illustrated in FIGS. 6D and 6E.

This microstructured surface section 150 opens up the possibility of selecting the microstructure 150a-150c best suited for the transferring or wiping off according to a particle property. For example, the microstructure 150a is better suited for relatively large particles 130 and the microstructure 150c is better suited for relatively small particles 130. "Relatively large particles" are for example particles 130 that are larger than 0.5 μm, and "relatively small particles" are those which are smaller than or equal to 0.5 μm.

Figure 6G:
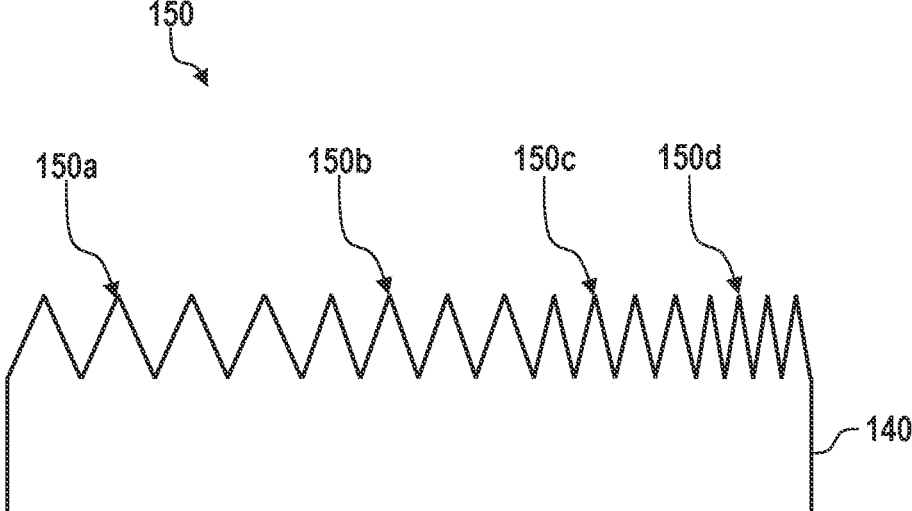

FIG. 6G shows a further exemplary embodiment of a deposition unit 140 having a microstructured surface section 150 which has four different microstructures 150a-150d in four regions. These are for example microstructures that are structured as shown in FIG. 6B. The four microstructures 150a-150d differ in particular in the period or spatial frequency of the repeating structure, with the spatial frequency increasing from the microstructure 150a to the microstructure 150d. Here, too, it is possible to select the best suited microstructure 150a-150d for the wiping off of a particle 130 according to particle properties.

Although the microstructured surface section 150 is illustrated in each case on a deposition unit 140 in FIGS. 6A-6G, it may also be provided in each case on the sample 110.

Figure 7:
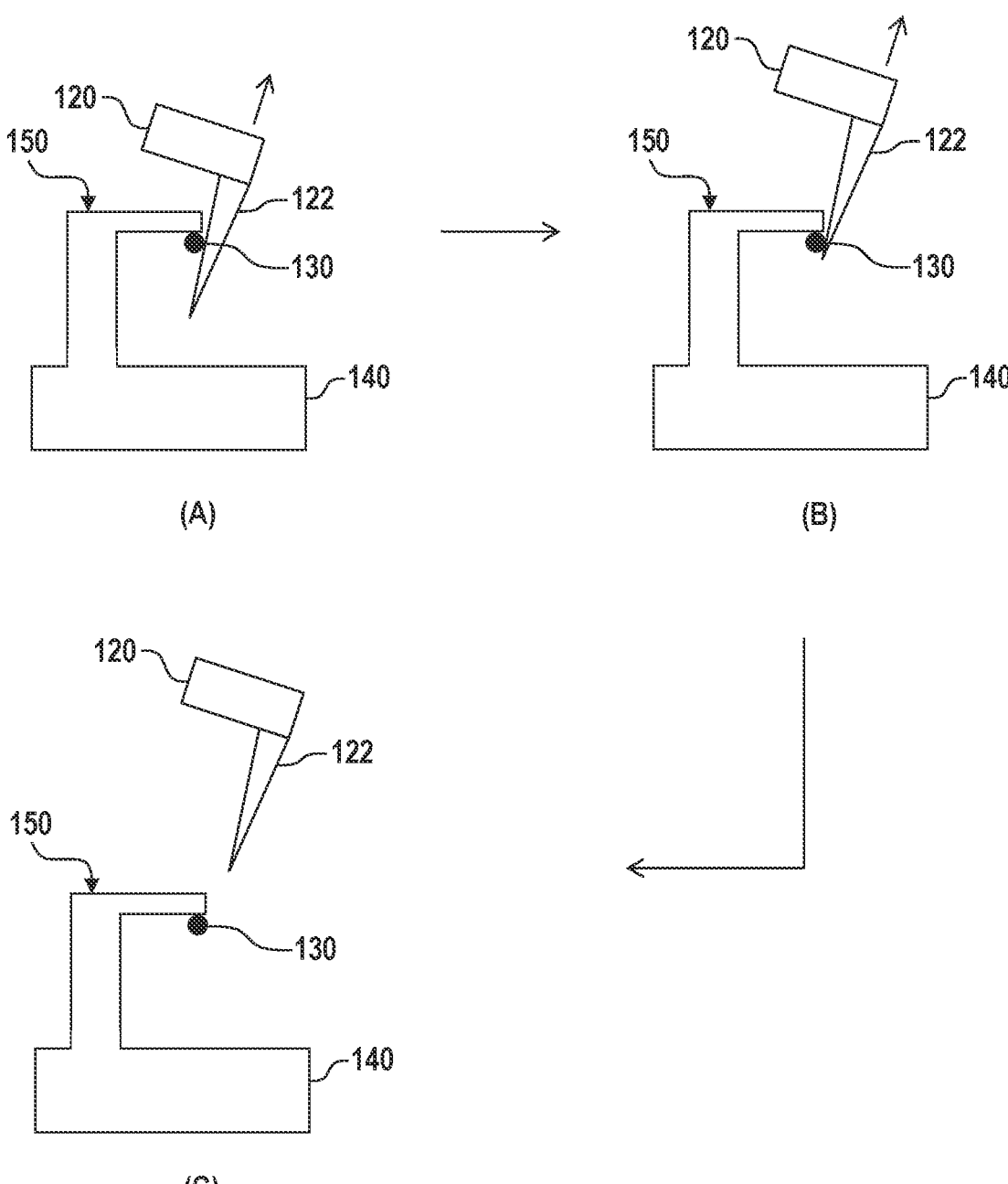
FIG. 7 shows three schematic images (A)-(C) of an exemplary embodiment for the wiping of a particle off from a measuring tip on a microstructured surface of a deposition unit.

FIG. 7 shows three schematic images (A)-(C) of an exemplary embodiment for the wiping of a particle 130 off from a measuring tip 122 on a microstructured surface of a deposition unit 140. The microstructured surface here forms the activated surface section 150. In this example, the surface has the microstructure 140c of FIG. 6. The illustrated deposition unit 140 can be used for example as described with reference to FIG. 1.

As illustrated in image (A) of FIG. 7, the measuring tip 122 can be positioned such that the measuring tip 122 extends into a spatial region below the overhang of the microstructure. In this way, the edge of the free end of the overhang can be used as a steric hindrance for the particle 130.

If the measuring tip 122 is retracted for example in a direction parallel to a direction of extent of the measuring tip 122, as illustrated in image (B) of FIG. 7, then the particle 130 is displaced along the measuring tip 122 toward the free end of the measuring tip 122, since it is blocked by the microstructure. Those sections of the particle 130 which are displaced beyond the free end of the measuring tip 122 become detached from the measuring tip 122 in the process. The overall contact surface of the particle 130 with the measuring tip 122, and hence the strength of the adsorption of the particle 130 on the measuring tip 122, is thus continuously reduced. Finally, a point is reached at which the particle 130 adheres more strongly to the surface 150 than to the measuring tip 122.

When the measuring tip 122 is then fully retracted, as illustrated in image (C) of FIG. 7, the particle 130 remains on the surface 150.

Figure 8:
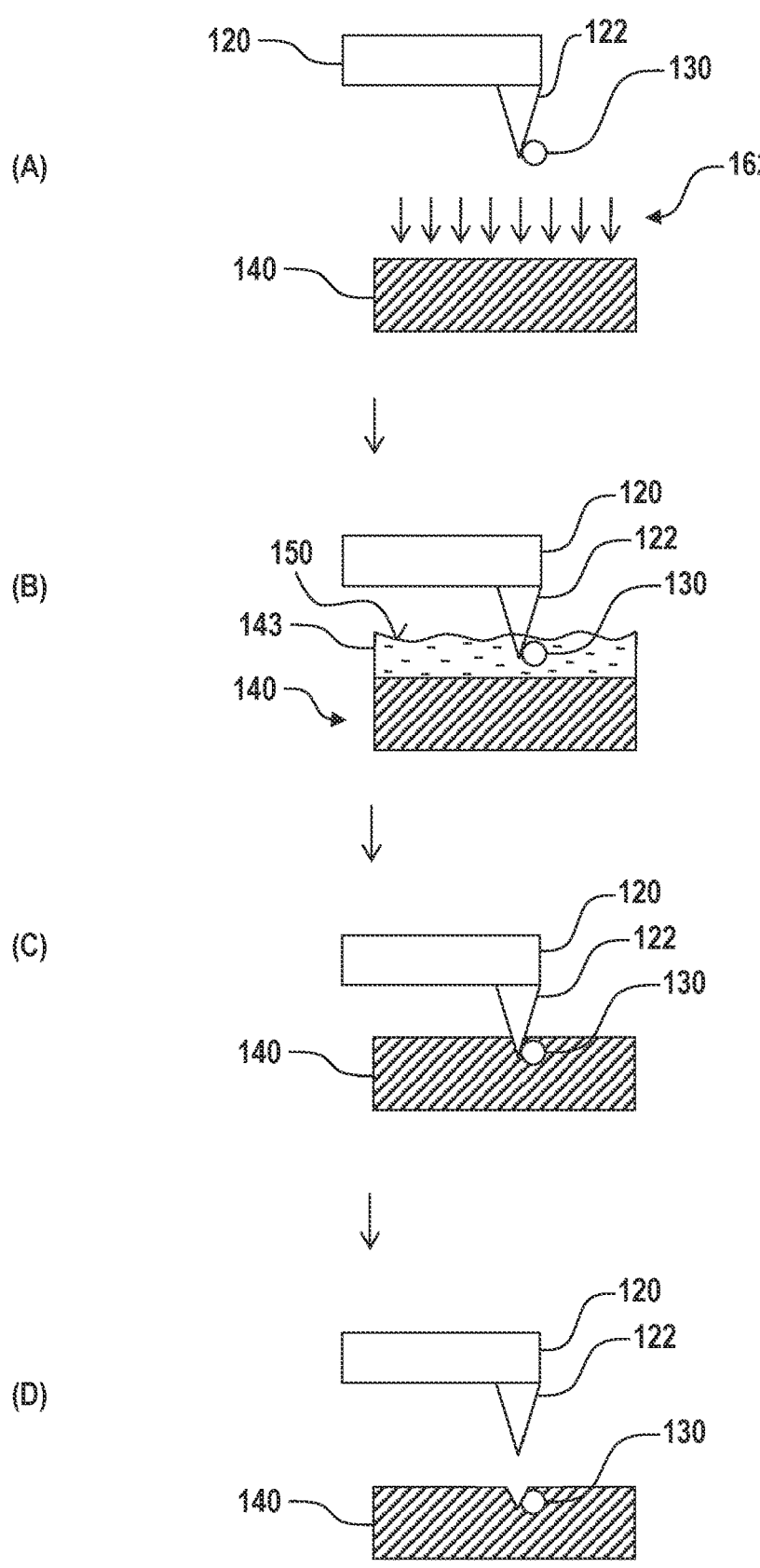
FIG. 8 shows four schematic images (A)-(D) of an exemplary embodiment for the transferring of a particle from a measuring tip to a deposition unit by use of melting.

FIG. 8 shows four schematic images (A)-(D) of an exemplary embodiment for the transferring of a particle 130 from a measuring tip 122 to a deposition unit 140 by use of melting a near-surface layer 143 of the deposition unit 140. The illustrated deposition unit 140 is composed of indium in this example and can be used for example as described with reference to FIG. 1.

Image (A) of FIG. 8 shows the measuring tip 122 with the particle 130 adhering thereon. The particle 130 has been taken up from a sample 110 (see FIG. 1, 9 or 11) as illustrated and described with reference to the images (A) and (B) of FIG. 1. Energy 162 is supplied to the deposition unit 140, for example in the form of radiation energy, which results in heating of the surface of the deposition unit 140. The energy 162 may also be supplied electrically as current, for example, as described with reference to FIG. 4.

The supply of energy leads to melting of a near-surface layer 143 of the deposition unit 140. The measuring tip 122 is dipped into the molten layer 143 until the particle 130 is surrounded by the molten material, as illustrated in image (B) of FIG. 8. Depending on the kind of material that the particle 130 is composed of, the particle 130 may in the process partially or completely melt and join with the molten material.

The supply of energy is then ended, for which reason the molten layer 143 cools and may solidify. This is illustrated in image (C) of FIG. 8. Strong bonding forces can form between the particle 130 and the solidified material during the solidification, in particular when the particle 130 has been at least partially fused, and/or the particle 130 is encapsulated by the solidified material, such that it cannot move.

Therefore, as illustrated in image (D) of FIG. 8, the measuring tip 122 can be withdrawn from the deposition unit 140 with the particle 130 remaining behind.

FIG. 9 shows five schematic images (A)-(E) of a further exemplary embodiment for the removal of a particle 130 from a sample 110 by use of a processing arrangement 120 taking the form of an atomic force microscope.

Image (A) of FIG. 9 shows the initial situation, in which the particle 130 is adsorbed on the sample surface 111 of the sample 110. The atomic force microscope 120 with a measuring tip 122, which here is made from carbon, is located above the sample 110.

The atomic force microscope 120 moves the measuring tip 122, for example using a microactuator (not shown), to the particle 130 on the sample surface 111. Image (B) of FIG. 1 shows how the measuring tip 122 makes contact with the particle 130. The particle 130 is taken up by the measuring tip 122, that is to say it detaches from the sample surface 111 and adheres to the measuring tip 122. A supportive pivoting movement may for example be carried out with the measuring tip 122 to this end.

The measuring tip 122 with the adhering particle 130 is moved away from the sample 110, as is shown in image (C) of FIG. 1. The particle 130 is thus removed from the sample surface 111.

In order to ensure that the particle 130 no longer detaches undesirably from the measuring tip 122, the measuring tip 122 is treated physicochemically so that the particle 130 is anchored on the measuring tip 122. This is illustrated in image (D) of FIG. 9, where in this example energy 162 is irradiated onto the measuring tip 122, in particular at a position at which the particle 130 adheres to the measuring tip 122. As a result of this, the measuring tip 122 is for example locally (or else entirely) heated so strongly that the particle 130 is fused on the measuring tip 122. Alternatively, a chemical reaction between the measuring tip 122 and the particle 130 may also be activated (not illustrated), possibly with the supply of a process gas PG (see FIG. 10).

As illustrated in image (E) of FIG. 9, the particle 130 after this process is firmly bonded to the measuring tip 122. The measuring tip 122 can therefore be reused without worries.

FIG. 10 schematically shows an exemplary embodiment of an apparatus 100 for analyzing and/or processing a sample 110 with the aid of a processing arrangement 120 taking the form of an atomic force microscope. The atomic force microscope 120 has a measuring tip 122 and a movement unit (not provided with a reference sign) with which the measuring tip 122 can be moved. The measuring tip 122 thereby can preferably be moved in three spatial directions and can preferably be rotated about at least one axis.

The apparatus 100 comprises a housing 102 which can be evacuated to a residual gas pressure of $10^{-5}$-$10^{-9}$ mbar for example by use of a vacuum pump 104. The atomic force microscope 120 is arranged in the housing 102. Furthermore, a sample stage 106 is provided for holding the sample 110 and a deposition unit 140. The sample stage 106 is preferably mechanically damped and/or held in a manner decoupled from the housing 102 by use of a mounting 108. The sample stage 102 can furthermore have a positioning unit (not illustrated), by means of which the sample stage 102 is displaceable for example in three spatial directions and is rotatable for example about at least one axis.

Furthermore, an activation unit 160 for modifying a physical and/or chemical nature of a surface section on the sample 110 or on the deposition unit 140 for providing an activated surface section 150 (see FIGS. 1-9) is arranged in the housing 102. The activation is effected as described for example with reference to any of FIGS. 1-9. The activation unit 160 for example takes the form of a laser and is configured for irradiating a laser beam onto the surface section to be activated.

In addition, an electron column 170 is arranged in the housing 102. The electron column 170 is configured for providing an electron beam 172 (one example of a particle beam). The electron column 170 can in particular take the form of an electron microscope (one example of a microscope) and can be used for monitoring the taking up of a particle 130 (see FIG. 1 or 7-9) with the measuring tip 122 and the transferring of the taken-up particle 130 to the activated surface section 150.

In conjunction with a process gas providing unit 180, the electron column 170 may additionally be used for conducting particle beam-induced processing processes on the sample 110, on the deposition unit 140 and/or on the measuring tip 122. To this end, for example, a process gas PG is supplied by use of the process gas providing unit 180. The process gas PG preferably comprises at least one precursor gas which is convertible into a reactive chemical form by irradiation with the particle beam 172 or by secondary processes which are triggered by the particle beam 172. The process gas PG is preferably supplied in a targeted manner to the position to be processed. The particle beam 172, in this case the electron beam 172, is then irradiated onto the position to be processed. As a result, for example, a chemical reaction is triggered between constituents of the process gas PG and the sample surface 111 (see FIG. 1 or 9), the surface of the deposition unit 140, the surface of the measuring tip 122 and/or the particle 130. The chemical reaction may comprise an etching and/or deposition of material and/or a replacement of atoms in a material.

A particle 130 adhering on the sample surface 111 of the sample 110 can be taken up with the measuring tip 122. To this end, the measuring tip 122 is accordingly moved for example by use of the movement unit. The sample stage 102 may also be displaced as a supportive measure by use of its positioning unit. The taking up is monitored in particular live with the electron microscope 170.

The measuring tip 122 is then moved by use of the movement unit into an interaction region of the activated surface section 150 so that the taken-up particle 130 is transferred from the measuring tip 122 to the activated surface section 150. This is effected as described for example with reference to any of FIG. 1 or 7-9.

The illustrated apparatus 100 comprises a number of optional elements which do not necessarily have to be present. These are in particular the housing 102, the vacuum pump 104, the sample stage 106, the electron column 170 and the process gas providing unit 180.

Figure 11:
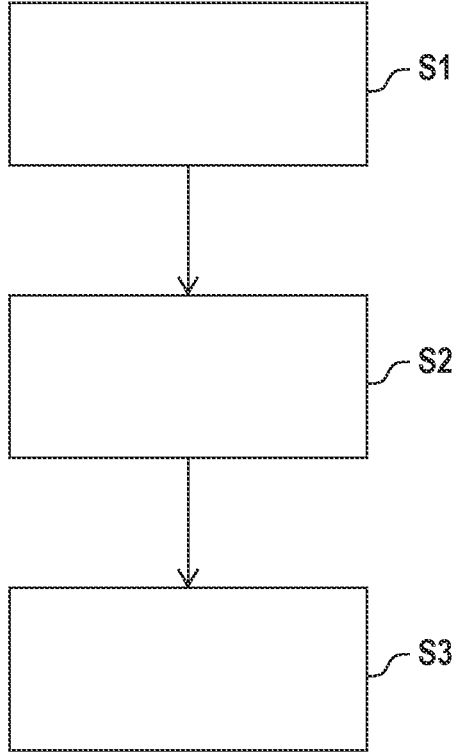
FIG. 11 shows a schematic block diagram of an exemplary embodiment of a method for processing a sample with a processing arrangement.

FIG. 11 shows a schematic block diagram of an exemplary embodiment of a method for processing a sample 110 (see FIG. 1, 3, 9 or 10) with a processing arrangement 120 (see FIG. 1 or 7-10).

In a first step S1, a particle 130 (see FIG. 1 or 7-9) adhering on a sample surface 111 (see FIG. 1, 3 or 9) of the sample 110 is taken up with a measuring tip 122 (see FIG. 1 or 7-9) of the processing arrangement 120. In a second step S2, a physical and/or chemical nature of a surface section on the sample 110 or on a deposition unit 140 (see FIG. 1, 2, 4-8 or 10) is modified for providing an activated surface section 150 (see FIGS. 1-8). In a third step S3, the measuring tip 122 is moved into an interaction region of the activated surface section 150 in which an attractive interaction acts between the particle 130 taken up by the measuring tip 122 and the activated surface section 150 in order to transfer the particle 130 from the measuring tip 122 to the activated surface section 150.

The method can be conducted for example with one of the deposition units 140 described with reference to FIG. 2 or 4-8, The method can in particular be conducted with an apparatus 100 as described with reference to FIG. 10.

In one embodiment, the activated surface section 150 is a microstructured surface section 150. That is to say that the second step S2 relates to the microstructuring of the surface section. The modifying of the physical and/or chemical nature of the surface section is thus provided by the production of the microstructuring. This may in particular be carried out prior to the taking up of the particle 130, that is to say prior to step S1.

Figure 12:
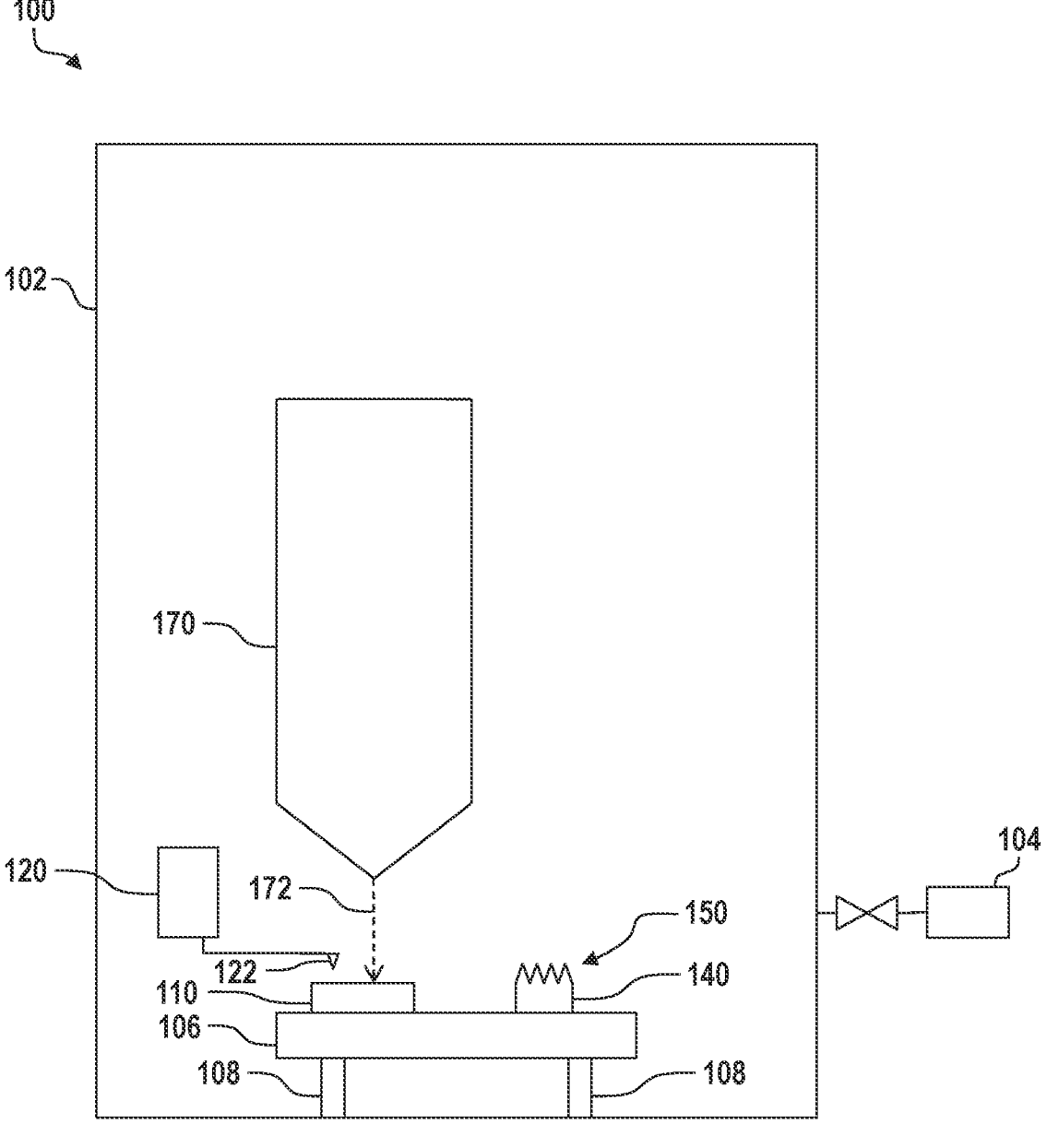
FIG. 12 schematically shows a further exemplary embodiment of an apparatus for analyzing and/or processing a sample.

FIG. 12 schematically shows a further exemplary embodiment of an apparatus 100 for analyzing and/or processing a sample 110 with the aid of a processing arrangement 120 taking the form of an atomic force microscope. The apparatus 100 has a similar construction to that of FIG. 10, for which reason the explanations in relation to FIG. 10 are likewise applicable here with the exception of the following observations. In contrast to FIG. 10, no activation unit 160 and no process gas providing unit 180 are present in this example. In addition, the deposition unit 140 has a microstructured surface section 150 which is suitable for wiping off particles 130 taken up by the measuring tip 122, as has been explained in detail with reference to the preceding figures.

Although the present invention has been described on the basis of exemplary embodiments, it can be modified in various ways.

LIST OF REFERENCE SIGNS

100 Apparatus
102 Housing
104 Vacuum pump
106 Sample stage
108 Mounting
110 Sample
111 Surface
112 Layer
120 Processing arrangement
122 Measuring tip
130 Particle
140 Deposition unit
141 Layer
142 Desorbed material
143 Molten region
150 Activated/microstructured surface section
150a Microstructure
150b Microstructure
150c Microstructure
150d Microstructure
160 Activation unit
162 Energy
164 Power source
166 Switch
170 Electron column
172 Electron beam
180 Process gas providing unit
α Angle
β Angle
γ Angle
D1 Width
D2 Width H Height
I Current
PG Process gas
S1 Method step
S2 Method step
S3 Method step
W Spacing
x Coordinate axis
y Coordinate axis
z Coordinate axis
What is claimed is:

1. A method for processing a sample with a processing arrangement comprising an atomic force microscope, comprising:
   taking up a particle adhering on a sample surface of the sample with a measuring tip of the processing arrangement;
   providing a microstructured surface section having a specific microstructure on the sample or on a deposition unit, a cross section of the specific microstructure having a periodic profile in a first cross-sectional plane; and
   moving the measuring tip into an interaction region of the microstructured surface section in which an interaction acts between the particle taken up by the measuring tip and the microstructured surface section in order to transfer the particle from the measuring tip to the microstructured surface section.

2. The method of claim 1, wherein the cross section has a zigzag profile.

3. The method of claim 1, wherein the first cross-sectional plane lies perpendicular to a main plane of extent of the sample or of the deposition unit and wherein a further cross section of the specific microstructure is constant in a second cross-sectional plane perpendicular to the first cross-sectional plane and perpendicular to the main plane of extent.

4. The method of claim 1, wherein the microstructured surface section comprises a plurality of regions having respective microstructures, with microstructures being structured differently in different regions.

5. The method of claim 4, wherein a first region has the specific microstructure and a second region has a second microstructure, wherein the first cross-sectional plane of the second microstructure extends differently to the main plane of extent and obliquely to the first cross-sectional plane of the specific microstructure.

6. The method of claim 4, wherein a first region has the specific microstructure and the specific microstructure has first values for structure parameters ($\alpha$, $\beta$, H, W), wherein the structure parameters ($\alpha$, $\beta$, H, W) comprise a height, a first angle, a second angle and/or a spatial frequency along the first cross-sectional plane, and wherein a second region has a second microstructure which has a value for at least one of the structure parameters ($\alpha$, $\beta$, H, W) which is different from the first value.

7. The method of claim 4, wherein a first region has the specific microstructure and a further region has a further microstructure, wherein the further microstructure has a cross section comprising an overhang.

8. The method of claim 4, further comprising:
   selecting a region from the plurality of regions depending on an adhesion position of the particle taken up by the measuring tip and/or on a property of the particle, the property comprising a size of the particle, a shape of the particle and/or a nature of the particle, and
   transferring the particle to the microstructure in the selected region.

9. The method of claim 8, wherein the adhesion position and/or the property of the particle is determined depending on an image of the particle, in particular an electron micrograph, captured before and/or after taking up the particle with the measuring tip.

10. The method of claim 1, wherein the respective microstructure is produced by a selective etching process and/or deposition process on the surface of the sample or of the deposition unit.

11. The method of claim 1, further comprising:
   modifying a physical and/or chemical nature of the microstructured surface section, in that the microstructured surface section is irradiated with a particle beam and/or is heated and/or is coated.

12. The method of claim 1, wherein the sample or the deposition unit includes a material selected from the group comprising silicon, silicon carbide, tungsten, tungsten carbide, cobalt, carbon, indium and platiniridium.

13. The method of claim 1, wherein the transferring of the particle to the microstructured surface section comprises wiping off the particle by way of a movement of the measuring tip relative to the sample or the deposition unit.

14. The method of claim 1, wherein the measuring tip is heated, irradiated and/or electrically charged for the transferring of the particle.

15. The method of claim 1, wherein the microstructured surface section is heated, irradiated and/or electrically charged before, during and/or after the transferring of the particle.

16. The method of claim 1, wherein the sample and the processing arrangement or the sample, the processing arrangement and the deposition unit are arranged in a vacuum housing.

17. The method of claim 1, wherein the particle adsorbed on the microstructured surface section is analyzed in situ with a particle beam.

18. An apparatus for analyzing and/or processing a sample, comprising:
   a processing arrangement comprising an atomic force microscope with a measuring tip for taking up a particle adhering on a sample surface of the sample;
   wherein a microstructured surface section having a specific microstructure is provided on the sample or on a deposition unit separate from the sample, a cross section of the specific microstructure having a periodic profile in a first cross-sectional plane, and
   a movement unit which is configured to move the measuring tip into an interaction region of the microstructured surface section in which an interaction acts between the particle taken up by the measuring tip and the microstructured surface section in order to transfer the particle taken up from the measuring tip to the microstructured surface section.

19. The apparatus of claim 18, further comprising an electron microscope for capturing an image of the sample, of the measuring tip, of the deposition unit and/or of the particle, when the latter is disposed on the sample surface, on the measuring tip and/or on the microstructured surface section.

20. A method for processing a sample with a processing arrangement, comprising the steps of:
   taking up a particle adhering on a sample surface of the sample with a measuring tip of the processing arrangement, and
   physicochemically treating the measuring tip causing the particle to be more securely fixed on the measuring tip.

21. A method for processing a sample with a processing arrangement, comprising the steps of:

taking up a particle adhering on a sample surface of the sample with a measuring tip of the processing arrangement;

supplying a process gas to a processing position on the sample or on a deposition unit;

irradiating a particle beam onto the processing position to trigger a local chemical reaction for generating a microstructure at the processing position; and moving the measuring tip into an interaction region of the generated microstructure in which an interaction acts between the particle taken up by the measuring tip and the generated microstructure in order to transfer the particle from the measuring tip to the generated microstructure.

22. A method for processing a sample with a processing arrangement, comprising:

taking up a particle adhering on a sample surface of the sample with a measuring tip of the processing arrangement;

capturing an image of the particle taken up by the measuring tip;

determining one or more properties of the particle taken up by the measuring tip depending on the captured image;

selecting a microstructure from a plurality of different microstructures that are disposed in a microstructured surface section on the sample or on a deposition unit, depending on the properties determined; and moving the measuring tip into an interaction region of the selected microstructure in the microstructured surface section in which an interaction acts between the particle taken up by the measuring tip and the selected microstructure in order to transfer the particle from the measuring tip to the microstructured surface section.

* * * * *